United States Patent
Jeong et al.

(10) Patent No.: US 8,552,452 B2
(45) Date of Patent: Oct. 8, 2013

(54) LIGHT EMITTING DEVICE AND LIGHTING INSTRUMENT INCLUDING THE SAME

(75) Inventors: Hwan Hee Jeong, Seoul (KR); Sang Youl Lee, Seoul (KR); Young kyu Jeong, Seoul (KR); Chung song Kim, Seoul (KR); June O Song, Seoul (KR); Kwang Ki Choi, Seoul (KR); Eun Joo Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/213,767

(22) Filed: Aug. 19, 2011

(65) Prior Publication Data

US 2012/0061704 A1    Mar. 15, 2012

(30) Foreign Application Priority Data

Oct. 11, 2010   (KR) .................. 10-2010-0098651
Oct. 25, 2010   (KR) .................. 10-2010-0103914

(51) Int. Cl.
*H01L 33/00*   (2010.01)

(52) U.S. Cl.
USPC   257/98; 257/99; 257/E33.072; 257/E33.075; 257/E33.066

(58) Field of Classification Search
None
See application file for complete search history.

(56) References Cited

U.S. PATENT DOCUMENTS

| | | | |
|---|---|---|---|
| 6,881,985 B2 * | 4/2005 | Murakami et al. | 257/99 |
| 2009/0273003 A1 * | 11/2009 | Park | 257/99 |
| 2011/0133242 A1 * | 6/2011 | Choi et al. | 257/99 |

FOREIGN PATENT DOCUMENTS

| | | |
|---|---|---|
| JP | 2010-080542 | 4/2010 |
| KR | 1020090027329 | 3/2009 |
| KR | 1020100058072 | 6/2010 |
| KR | 10-0986461 | 10/2010 |
| KR | 100986374 | 10/2010 |

* cited by examiner

*Primary Examiner* — Yasser Abdelaziez
(74) *Attorney, Agent, or Firm* — Lowe Hauptman & Ham, LLP

(57) ABSTRACT

Disclosed is a light emitting device including, a second electrode layer, a light emitting structure that includes a second conductive semiconductor layer, an active layer and a first conductive semiconductor layer and that is provided on the second electrode layer, a first electrode layer that includes a pad part and an electrode part connected to the pad part and that is provided on the light emitting structure, and a current blocking layer arranged between the second electrode layer and the light emitting structure in such a way that a part of the current block layer overlaps to correspond to the first electrode layer, wherein a width of the current blocking layer corresponding to the electrode part is different depending upon a clearance with the pad part.

18 Claims, 20 Drawing Sheets

LIGHT EMITTING DEVICE AND LIGHTING INSTRUMENT INCLUDING THE SAME

CROSS REFERENCE TO RELATED APPLICATION

This application claims priority under 35 U.S.C. §119 to Korea Application No 10-2010-0098651 filed in Korea on 11 Oct. 2010 and No 10-2010-0103914 filed in Korea on 25 Oct. 2010 which are hereby incorporated in its entirety by reference as if fully set forth herein.

TECHNICAL FIELD

Embodiments relate to a light emitting device and a light-emitting device package.

BACKGROUND

A light emitting device for a lighting instrument should provide white light through LEDs. A white semiconductor light-emitting apparatus may be generally realized by the following three methods.

First, three LEDs emitting the three primary colors of light, that is, red, green and blue, respectively, are combined to realize white light. Light emitting materials used herein generally include InGaN or AlInGaP phosphor. A second method is to use a UV LED as a light source to excite a three primary color phosphor, in turn emitting white light. In this case, an InGaN/R, G, B phosphor is used as a light emitting material. Third, a blue LED as a light source may excite a yellow phosphor, thus embodying white light. For this method, an InGaN/YAG:Ce phosphor is generally used.

SUMMARY

Embodiments are directed to provision of a light emitting device with enhanced luminous efficiency and reliability.

Therefore, according to one embodiment, there is provided a light emitting device which includes: a second electrode layer; a light emitting structure that includes a second conductive semiconductor layer, an active layer and a first conductive semiconductor layer and that is provided on the second electrode layer; a first electrode layer that includes a pad part and an electrode part connected to the pad part and that is provided on the light emitting structure; and a current blocking layer arranged between the second electrode layer and the light emitting structure, wherein a part of the current block layer overlaps to correspond to the first electrode layer, wherein a width of the current blocking layer corresponding to the electrode part is different depending upon a clearance with the pad part.

The width of the current blocking layer may increase with decreasing distance to the pad part.

The electrode part may include an outer electrode provided at a peripheral side of the light emitting structure and at least one inner electrode arranged at inner side of the outer electrode and connected to the outer electrode, wherein the pad part may be connected to at least one of the outer electrode and the inner electrode.

A part of the current blocking layer, corresponding to a first area of the electrode part, may have a larger width than another part of the current blocking layer which corresponds to a second area of the electrode part, wherein the first area may be closer to the pad part than the second area.

The current blocking layer part corresponding to at least a part of the electrode part may have increased width with decreasing distance to the pad part.

The current blocking layer may include an overlap part and non-overlap part which correspond respectively to the electrode part and a width of the non-overlap part of the current blocking layer may be varied depending upon a clearance with the pad part.

The width of the non-overlap part of the current blocking layer corresponding to at least a part of the electrode part may increase with decreasing distance to the pad part.

The width of the non-overlap part of the current blocking layer corresponding to the first area of the electrode part may be greater than that of another non-overlap part of the current blocking layer, which corresponds to the second area of the electrode part, wherein the first area may be closer to the pad part than the second area. The width of the current blocking layer may linearly increase.

The width of the current blocking layer part which corresponds to the first and second areas of the electrode part, respectively, may linearly increase.

The width of the non-overlap part of the current blocking layer, which corresponds to the first and second areas of the electrode part, respectively, may linearly increase.

The light emitting device may cover a lateral side and a part of the top side of the light emitting structure and further include a passivation layer contacting one side of the outer electrode. The current blocking layer may further include another part extending to the other side of the outer electrode while not overlapping with the outer electrode.

A width of the current blocking layer part not overlapping with the outer electrode may be 5 to 350% that of the outer electrode. On the other hand, a width of the current blocking layer part not overlapping with the inner electrode may be 5 to 350% that of the inner electrode.

The current blocking layer a third area not overlapping with the inner electrode in one direction of the inner electrode and a fourth area not overlapping with the inner electrode in the other direction of the inner electrode. The third area may have a width different from that of the fourth area. The width of the electrode part may be constant. The width of the current blocking layer may increase stepwise.

The light emitting device according to another embodiment may include; a substrate; a light emitting structure including a first conductive semiconductor layer, an active layer and a second conductive semiconductor layer, which is provided on the substrate; a conductive layer provided on the light emitting structure; an electrode layer including a pad part and at least one expanded electrode part extending from the pad part, which is provided on the conductive layer; and a current blocking layer arranged between the conductive layer and the light emitting structure in such a way that at least a part of the current block layer overlaps to correspond to the electrode layer, wherein a width of the current blocking layer corresponding to the expanded electrode part is different depending upon a clearance to the pad part. The width of the current blocking layer part which corresponds to the expending electrode part may increase with decreasing distance to the pad part.

A lighting instrument according to one embodiment may include a power supply connector to supply power, a heat sink coupled to the power supply connector and a light emitting device mounted on a circuit board and, in addition, a light emitting module fixed to the heat sink and a reflector coupled to the bottom of the heat sink to reflect light emitted by the light emitting module, wherein the light emitting device may be the same as described in the foregoing embodiments.

BRIEF DESCRIPTION OF THE DRAWINGS

The accompanying drawings, which are included to provide a further understanding of the disclosure and are incorporated in and constitute a part of this application, illustrate embodiment(s) and together with the description serve to explain the principle of the disclosure. In the drawings.

DESCRIPTION OF SPECIFIC EMBODIMENTS

Figure 1:
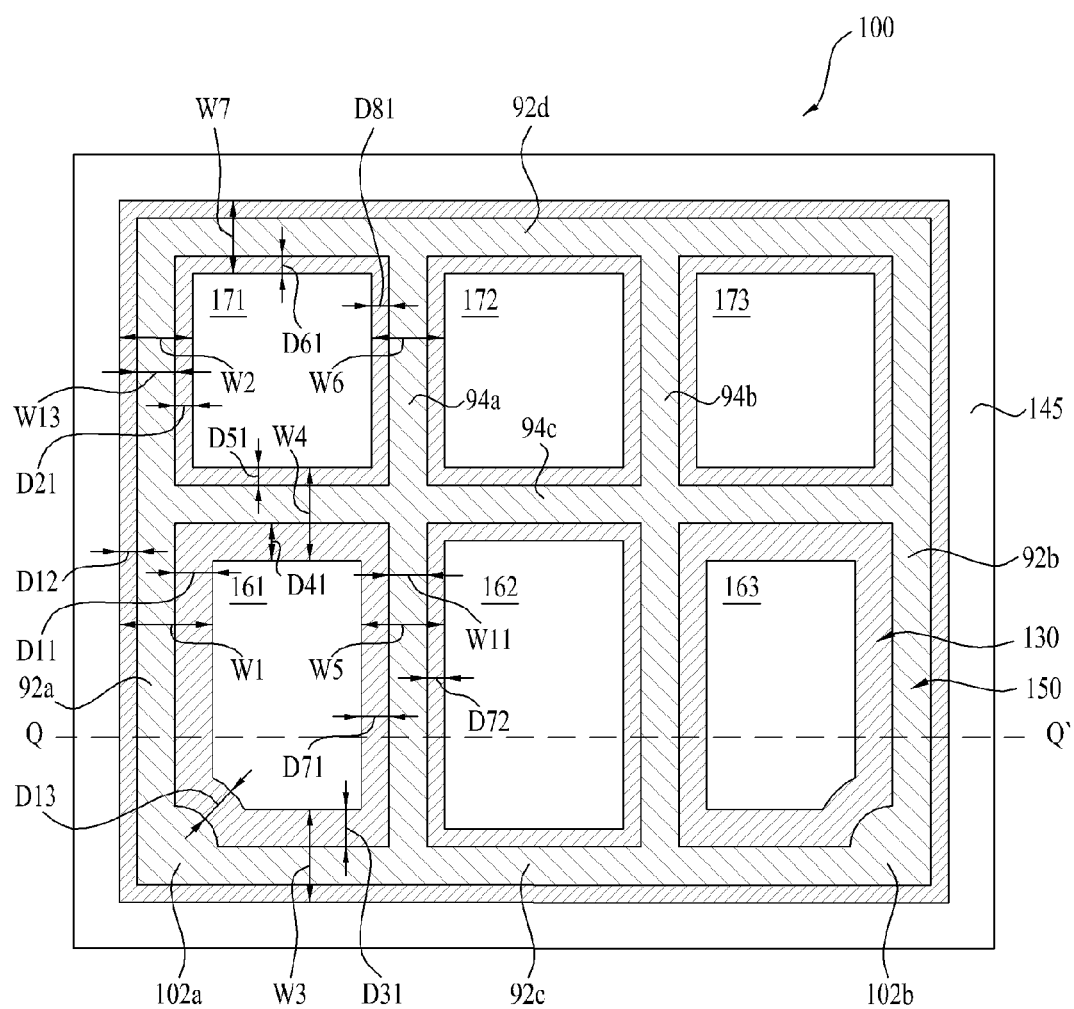
FIG. 1 is a plan view illustrating a light emitting device according to a first embodiment.

Hereinafter, exemplary embodiments will be more apparent from the following description with reference to the accompanying drawings.

In the description of the embodiments, it will be understood that when an element such as a layer (film), region, pattern, or structure is referred to as being formed "on" or "under" another element, such as a substrate, layer (film), region, pad, or pattern, it can be "directly" "on" or "under" the other element or be "indirectly" formed with intervening elements therebetween. Further, "on" or "under" will be described based on illustration in the drawings.

In the drawings, thicknesses and/or sizes of respective layers may be enlarged, omitted or schematically illustrated for convenience of explanation or clarity. In addition, sizes of respective elements may not entirely reflect the real size thereof. Hereinafter, with reference to the accompanying drawings, a light emitting device, a preparation method thereof and a light-emitting device package according to embodiments will be described in detail.

Figure 2:
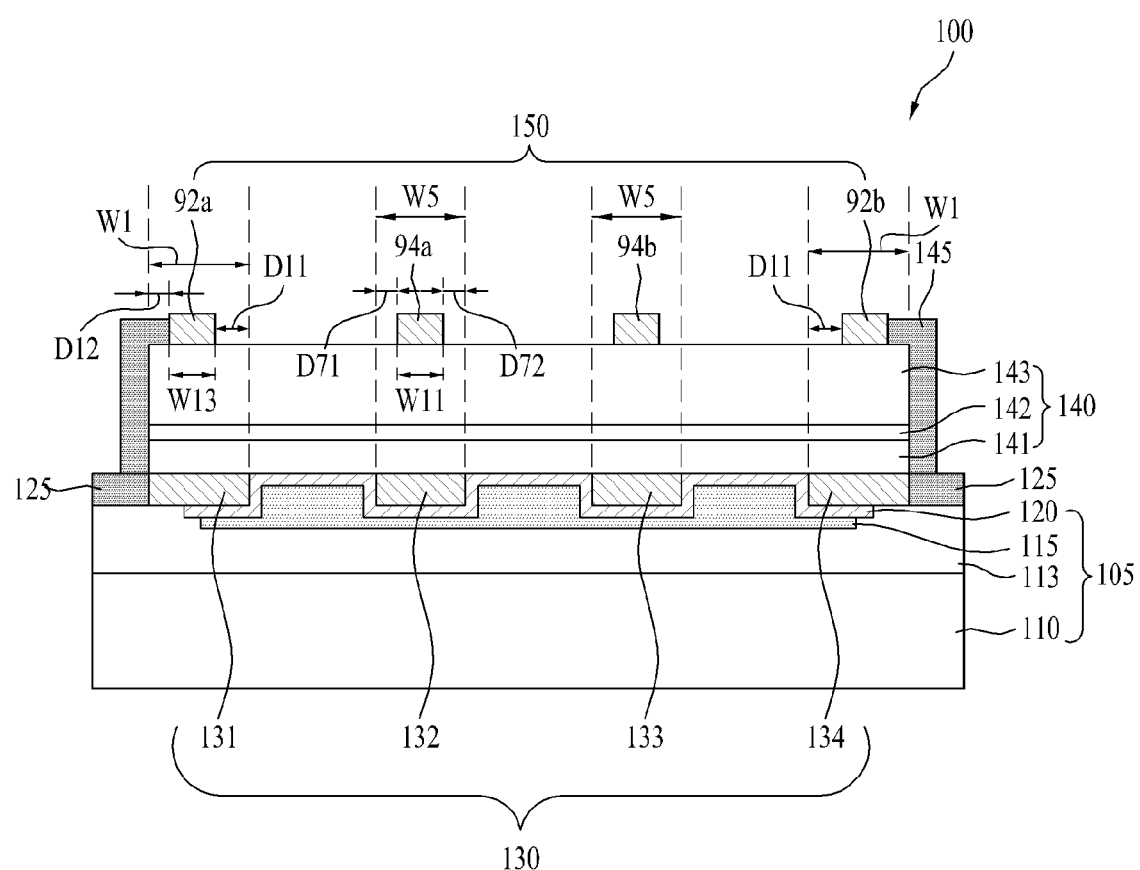
FIG. 2 is a cross-sectional view taken along lines (or direction) Q-Q' of the light emitting device shown in FIG. 1.

FIG. 1 is a plan view illustrating a light emitting device according to one embodiment, and FIG. 2 is a cross-sectional view taken along lines Q-Q' of the light emitting device shown in FIG. 1.

Referring to FIGS. 1 and 2, a light emitting device 100 includes a second electrode layer 105, a protective layer 125, a current blocking layer 130, a light emitting structure 140, a passivation layer 145 and a first electrode layer 150.

The second electrode layer 105 may support the light emitting structure 140 and supply a first power (i.e., a positive (+) power supply). The second electrode layer 105 may include a (support) substrate 110, an adhesion layer 113, a reflective layer 115 and an ohmic contact layer 120.

The substrate 110 may support the light emitting structure 140. The substrate 110 may comprise at least one of copper (Cu), gold (Au), nickel (Ni), molybdenum (Mo), copper-tungsten (Cu—W) and a carrier wafer (e.g., Si, Ge, GaAs, ZnO, SiC).

The reflective layer 115 may be arranged on the substrate 110. The reflective layer 115 may reflect incident light emitted by the light emitting structure 140, in turn improving light extraction efficiency. The reflective layer 115 may be formed using, for example, at least one selected from metals such as Ag, Ni, Al, Rh, Pd, Ir, Ru, Mg, Zn, Pt, Au or Hf, or alloys thereof.

The reflective layer 115 may be formed in a multi-layer structure using a light-transmitting conductive material such as IZO, IZTO, IAZO, IGZO, IGTO, AZO, and ATO. For example, it may be laminated in a structure such as IZO/Ni, AZO/Ag, IZO/Ag/Ni, or AZO/Ag/Ni. The reflective layer 115 is used to improve luminous efficiency, but is not necessarily provided.

An adhesion layer 113 may be interposed between the substrate 110 and the reflective layer 115. The adhesion layer 113 may prevent metal ions from being scattered out of the substrate 110 and serve as a bonding layer.

The adhesion layer 113 may contact the reflective layer 115, ohmic contact layer 120 and protective layer 125, in order to adhere the reflective layer 115, ohmic contact layer 120 and protective layer to the substrate 110. The adhesion layer 113 may comprise a barrier metal or bonding metal. The adhesion layer 113 may include, for example, at least one selected from Ti, Au, Sn, Ni, Cr, Ga, In, Bi, Cu, Ag or Ta. The adhesion layer 113 is used to attach the substrate 110 via bonding, however, is not necessarily provided if the substrate 110 is formed by plating or deposition. That is, the adhesion layer 113 is optional.

The ohmic layer 120 may be provided on the reflective layer 115. The ohmic layer 120 may be in ohmic contact with the light emitting structure 140 to supply the first power to the light emitting structure 140 and may include, for example, at least one selected from ITO, IZO, IZTO, IAZO, IGZO, IGTO, AZO or ATO.

In addition, the ohmic contact layer 120 may optionally include a light-transmitting conductive layer and/or metal. For instance, the ohmic layer 120 may be realized in a single or multi-layer structure using at least one selected from; indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO.

The ohmic layer 120 may enable smooth injection of a carrier into the light emitting structure 140 and/or a second conductive semiconductor layer 141 described below, but is not necessarily provided. For example, the ohmic contact layer 120 may be omitted and, instead, the reflective layer 115 may be formed using a specific material enabling ohmic contact with the second conductive semiconductor layer 141. In this regard, the reflective layer 115 may serve as an ohmic contact layer.

The current blocking layer 130 may be arranged between the ohmic contact layer 120 and the light emitting structure 140. That is, a top side of the current blocking layer 130 may contact the second conductive semiconductor layer 141 while a bottom side and lateral side of the current blocking layer 130 contact the ohmic contact layer 120.

The current blocking layer 130 may at least partially overlap with the first electrode layer 150 and, therefore, the current blocking layer 130 may relieve concentration of current at the shortest distance between the first electrode layer 150 and the substrate 110, thus improving luminous efficiency.

The current blocking layer 130 may be formed using a material having a lower electrical conductivity than the ohmic contact layer 120, a material enabling Schottky contact with the second conductive semiconductor layer 141, or an electrical insulating material. For instance, the current blocking layer 130 may include at least one selected from ZnO, $SiO_2$, SiON, $Si_3N_4$, $Al_2O_3$, $TiO_2$, Ti, Al or Cr.

The current blocking layer 130 may be provided between the ohmic contact layer 120 and the second conductive semiconductor layer 141 or, otherwise, between the reflective layer 115 and the ohmic contact layer 120, without being particularly limited thereto.

The protective layer 125 may be provided at a peripheral area of the second electrode layer 105. For instance, the protective layer 125 may be arranged at a periphery of the adhesion layer 113. If the adhesion layer 113 is not provided, the protective layer 125 may be formed around the substrate 110.

The protective layer 125 may alleviate degradation in reliability of the light emitting device 110 due to delamination of an interface between the light emitting structure 140 and the adhesion layer 113. The protective layer 125 may be a conductive protection layer made of a conductive material or a non-conductive protection layer made of a non-conductive material.

For example, the conductive protection layer may be formed of a transparent conductive oxide film or comprise at least one selected from Ti, Ni, Pt, Pd, Rh, Ir or W. On the other hand, the non-conductive protection layer may be formed of a material having a lower conductivity than the reflective layer 115 or ohmic contact layer 120, a material enabling Schottky contact with the second conductive semiconductor layer 141 or an electrical insulating material. For example, the non-conductive protection layer may comprise ZnO or $SiO_2$.

An area 131 of the protective layer 125 may overlap with the light emitting structure 140 while the other area may not overlap with the light emitting structure 140. Also, the protective layer 125 may overlap with the first electrode layer 150, i.e., outer electrodes 92a to 92fd in a vertical direction. Here, a part (the area) 131 of the protective layer 125 overlapping with the outer electrodes 92a to 92d may serve as the current blocking layer 131 or 134. Hereinafter, description of the current blocking layer 130 may also be applied to the area of the protective layer 125 overlapping with the outer electrodes 92a to 92d in the vertical direction.

One side of each of the outer electrodes 92a to 92d may contact a passivation layer 80 described below.

The current blocking layer 131 or 134 may extend in a direction to the other side of each of the outer electrodes 92a to 92d and may have an area not overlapping with the outer electrodes 92a to 92d. In this regard, the one side of each of the outer electrodes 92a to 92d may be the outer face of the light emitting device 100 shown in FIG. 2, while the other side of each of the outer electrodes 92a to 92d may be the inner face of the light emitting device 100.

A width D11 of the part of the current blocking layer 131 or 134, which extends in a direction to the other side ('the other side direction') of the outer electrodes 92a to 92d, may range from 5 to 350% of a width W13 of the outer electrodes 92a to 92d, wherein D11=k×W13, k=0.05 to 3.5.

The current blocking layer 132 or 133 may have a part not overlapping with inner electrodes 94a to 94c in both side directions of the inner electrodes 94a to 94c. The center of the inner electrodes 94a to 94c may be aligned with the center of the current blocking layer 132 or 134, which overlaps with the inner electrodes 94a to 94c.

A width D71 of the part of the current blocking layer 132 or 133, which does not overlap in a direction to one side ('the one side direction') of the inner electrodes 94a to 94c may range from 5 to 350% of a width W11 of the inner electrodes 94a to 94c, wherein D71=k×W11, k=0.05 to 3.5. Likewise, a width D72 of the other part of the current blocking layer 132 or 133, which does not overlap in a direction to the other side ('the other side direction') of the inner electrodes 94a to 94c may range from 5 to 350% of the width 11 of the inner electrodes 94a to 94c, wherein D72=k×W11, k=0.05 to 3.5. Here, D71 may be greater than D72 (D71>D72). Moreover, D11 may be different from D71 and D72.

The light emitting structure 140 may be provided on the second electrode layer 105. The light emitting structure 140 may also be provided on the ohmic contact layer 120 and current blocking layer 130. A lateral side of the light emitting structure 140 may become an inclined face during isolation etching to divide the structure into single chips.

The light emitting structure 140 may have a plurality of semiconductor layers comprising Group III-V compound semiconductor materials. The light emitting structure 140 may include the first conductive semiconductor layer 143, the active layer 142 positioned under the first conductive semiconductor layer 143 and the second conductive semiconductor layer 141 positioned under the active layer 142.

Briefly, the light emitting structure 140 may have a structure of the second conductive semiconductor layer 141, active layer 142 and first conductive semiconductor layer 143 sequentially laminated on the ohmic contact layer 120 and current blocking layer 130.

The first conductive semiconductor layer 143 may comprise a Group III-V semiconductor material doped with a first conductive dopant. For example, the first conductive layer 143 may be any one selected from GaN, AlN, AlGaN, InGaN, InN, InAlGaN, AllnN, AlGaAs, GaP, GaAs, GaAsP, AlGaInP, etc.

The active layer 142 may be provided under the first conductive semiconductor layer 143, and formed in at least one among a single quantum well structure, a multi-quantum well structure (MQW), a quantum dot structure or a quantum wire structure. Using Group III-V compound semiconductor materials, the active layer 142 may be formed in a well layer and barrier layer, for example, InGaN well layer/GaN barrier layer or InGaN well layer/AlGaN barrier layer.

A clad layer may be further provided between the active layer 142 and the first conductive semiconductor layer 143 or between the active layer 142 and the second conductive semiconductor layer 141. The conductive clad layer may be made of AlGaN based semiconductors.

The second conductive semiconductor layer 141 may be positioned under the active layer 142 and comprise a Group III-V compound semiconductor doped with a second conductive dopant. For example, the second conductive semiconductor layer 141 may be any one selected from GaN, AlN, AlGaN, InGaN, InN, InAlGaN, AlInN, AlGaAs, GaP, GaAs, GaAsP, AlGaInP, etc.

If the first conductive semiconductor layer is an N-type layer, the first conductive dopant may be an N-type dopant such as Si, Ge, Sn, Se, Te, etc. If the second conductive semiconductor layer is a P-type layer, the second conductive dopant may be a P-type dopant such as Mg, Zn, etc. In the case where the first conductive semiconductor layer is a P-type layer and the second conductive semiconductor layer is an N-type layer, the foregoing description will be also applied.

The light emitting structure 140 may include a third conductive semiconductor layer having polarity opposite to the second conductive semiconductor layer 141, which is provided under the second conductive semiconductor layer 141. For instance, the light emitting structure 140 may include at least one selected from N-P, P-N, N-P-N and P-N-P junction structures.

The first electrode layer 150 may be arranged on top of the light emitting structure 140, in such a way that the first electrode layer overlaps in a vertical direction to correspond to the current blocking layer 130. In this regard, the vertical direction may be a direction from the second conductive semiconductor layer 141 toward the first conductive semiconductor layer 143. The first electrode layer 150 may be branched in a desired pattern, without being particularly limited thereto.

The top side of the first conductive semiconductor layer 143 may have a roughness pattern (not shown) formed thereon, in order to increase light extraction efficiency. Here, the first electrode layer 150 may also have the roughness pattern formed on the top side.

The first electrode layer 150 shown in FIGS. 1 and 2 may be provided with a pad part 102a and 102b, and an electrode part 92a to 92d and 94a to 94c, which is connected to the pad part 102a and 102b. That is, except for the pad part 102a and 102b, the other area may be the electrode part 92a to 92d and 94a to 94c.

More particularly, the electrode part 92a to 92d and 94a to 94c includes outer electrodes 92a to 92d extending along a periphery of the top side of the first conductive semiconductor layer 143, as well as inner electrodes 94a to 94c formed in the outer electrodes 92a to 92d.

The outer electrodes 92a to 92d may be arranged in a rectangular shape having four sides and four apexes (on the light emitting structure 140). The outer electrodes 92a to 92d substantially comprise a first outer electrode 92a, second electrode 92b, third electrode 92c and fourth electrode 92d and these four electrodes, that is, the first electrode 92a, second electrode 92b, third electrode 92c and fourth electrode 92d may be adjacent to one another and arranged along a periphery of the top side of the first conductive semiconductor layer 143.

Both the first and second outer electrodes 92a and 92b may extend in a first direction while both the third and fourth electrodes 92c and 92d extend in a second direction. The outer electrodes 92a to 92d may be at least partially formed within 50 μm from the outermost peripheral side of the first conductive semiconductor layer 143, and one side of the outer electrodes 92a to 92d may contact a passivation layer 145. Here, the first direction may be one direction orienting from any one apex of the outer electrodes to another apex at one side adjacent to the former apex while the second direction is another direction orienting from any one apex of the outer electrodes to another apex at the other side adjacent to the former apex. The first direction may be perpendicular to the second direction.

The inner electrodes 94a to 94c substantially comprise a first inner electrode 94a, second inner electrode 94b and third inner electrode 94c. The first inner electrode 94a, second inner electrode 94b and third inner electrode 94c may be arranged in the outer electrodes 92a to 92d and connected thereto.

The pad part 102a and 102b refers to an area receiving power from the outside, in order to supply first power to the first conductive semiconductor layer 143. For instance, the pad part 102a and 102b may be a bonding region of a wire connected to a metal layer (i.e., a lead frame) of a light-emitting device package described below.

The pad part 102a and 102b may be connected to at least one of the outer and inner electrodes. More particularly, the pad part may include a first pad 102a and a second pad 102b. The first pad 102a may be provided on a part at which the first outer electrode 92a contacts the third outer electrode 92c. Likewise, the second pad 102b may be provided on another part at which the second outer electrode 92b contacts the third outer electrode 92c. For example, the first pad 102a may be arranged at any one apex among four apexes of the outer electrodes 92a to 92d while the second pad 102b may be arranged at another apex among the four apexes of the outer electrodes 92a to 92d.

More particularly, the first direction may be a length direction of the first and second outer electrodes 92a and 92b toward the pad part 102a and 102b and, similarly, the second direction may be a length direction of the third and fourth outer electrodes 92c and 92d. In this case, a width direction of the outer electrodes may be perpendicular to the length direction.

Each of the first and second inner electrodes 94a and 94b may extend in the first direction while the third inner electrode 94c may extend in the second direction. The third inner electrode 94c may extend in the second direction to connect the first outer electrode 92a with the second outer electrode 92b. In addition, each of the first and second inner electrodes 94a and 94b may extend in the first direction to connect the third and fourth outer electrodes 92c and 92d with the third inner electrode 94c. In this case, the length direction of the first and second inner electrodes 94a and 94b may be the first direction while the length direction of the third inner electrode 92c may be the second direction.

A distance between the third outer electrode 92c and the third inner electrode 94c may be greater than a distance between the fourth outer electrode 92d and the third inner electrode 94c. On the other hand, a distance between the first outer electrode 92a and the first inner electrode 94a, a distance between the first inner electrode 94a and the second inner electrode 94b and a distance between the second inner electrode 94b and the second outer electrode 92b, respectively, may be the same to each other.

An area of the first electrode layer 150 on which the first pad 102a and second pad 102b are formed may have a larger width than the other area of the first electrode layer 150. Except for the first pad 102a and second pad 102b, the other area of the first electrode layer 150, that is, the electrode part may have a predetermined width. For instance, the width of the outer electrodes 92a to 92d or the width of the inner electrodes 94a to 94c may be constant and the same to each other.

However, without being particularly limited to the foregoing embodiments, a width of a part of the outer electrodes 92a to 92*d* may be greater than the width of the inner electrodes 94*a* to 94*c* according to other embodiments.

The inner electrodes 94*a* to 94*c* have an inner region surrounded by the outer electrodes 92*a* to 92*d* and this inner region may be divided into a plurality of regions 161 to 163 and 171 to 173. Among the plural regions 161 to 163 and 171 to 173, the regions 161 to 163 with a larger width contacting the third outer electrode 92*c* may have a wider area, compared to the regions 171 to 173 having a smaller width contacting the fourth outer electrode 92*d*.

The inner electrodes 94*a* to 94*c* have an inner region surrounded by the outer electrodes 92*a* to 92*d* and this inner region may be divided into a plurality of regions 161 to 163 and 171 to 173. Among the plural regions 161 to 163 and 171 to 173, the regions 161 to 163 with a larger width contacting the third outer electrode 92*c* may have a wider area, compared to the regions 171 to 173 having a smaller width contacting the fourth outer electrode 92*d*.

The first electrode layer 150 of the light emitting device 100 according to one embodiment shown in FIG. 1, may be applied to the light emitting structure 140 having one side of 800 to 1200 μm. If a length of at least one side of the light emitting structure is less than 800 μm, a region of the light emitting structure from which light is emitted by the first electrode layer 150 may be decreased. On the contrary, if the length of the one side of the light emitting structure exceeds 1200 μm, current may not be efficiently supplied by the first electrode layer 150. For instance, the first electrode layer 150 shown in FIG. 1 may be applied to the light emitting structure 140 having horizontal (width) and vertical (length) sides of 1000 μm each.

The current blocking layer 130 and the first electrode layer 150 may correspond to each other in a vertical direction. That is, the current blocking layer 130 may correspond to the electrode part 92*a* to 92*d* and 94*a* to 94*c* in a vertical direction, which in turn includes an overlapped part (hereinafter, referred to as 'overlap part') and the other part without overlapping (hereinafter, referred to as 'non-overlap part'). In this regard, the vertical direction may be a direction from the first electrode layer 150 to the light emitting structure 140.

A width of the current blocking layer 130 corresponding to the electrode part 92*a* to 92*d* and 94*a* to 94*c* in the vertical direction may be different depending upon a clearance with the pad part 102*a* and 102*b*.

For instance, as the clearance with the pad part 102*a* and 102*b* is decreased, the width of the current blocking layer 130 may be increased.

A part of the current blocking layer 130 corresponding to the first area of the electrode part 92*a* to 92*d* and 94*a* to 94*c* may have a greater width than the other part of the current blocking layer 130 corresponding to the second area of the electrode part 92*a* to 92*d* and 94 to 94*c* in the vertical direction. Here, the first area of the electrode part 92*a* to 92*d* and 94*a* to 94*c* may be more closely adjacent to the first pad 102*a* than the second area thereof.

More particularly, a width of the first part of the current blocking layer 130 separated from the first pad 102*a* by a first distance may be greater than a width of the second part of the current blocking layer 130 separated from the first pad 102*a* by a second distance, wherein the first distance is less than the second distance. In this case, length and width directions of the current blocking layer 130 may be substantially the same as those of the electrode part 92*a* to 92*d* and 94*a* to 94*c*.

A width W1 (hereinafter, referred to as 'first width') of the current blocking layer part 130, which corresponds to the first outer electrode 92*a* placed between the first pad 102*a* and the third inner electrode 94*c*, may be greater than a width W2 (hereinafter, referred to as 'second width') of the current blocking layer part 130, which corresponds to the first outer electrode 92*a* placed between the third inner electrode 94*c* and the fourth outer electrode 92*d* (W1>W2).

In addition, a width W3 (hereinafter, referred to as 'third width') of the current blocking layer part 130, which corresponds to the third outer electrode 92*c* placed between the first pad 102*a* and the first inner electrode 94*a*, may be greater than a width W4 (hereinafter, referred to as 'fourth width') of the current blocking layer part 130, which corresponds to the third outer electrode 94*c* placed between the first outer electrode 92*a* and the first inner electrode 94*a* (W3>W4). Moreover, the first width W1 may be equal to the third width W3 (W1=W3).

The first width W1 may be equal to or greater than a width W5 (hereinafter, referred to as 'fifth width') of the current blocking layer part 130, which corresponds to the first inner electrode 94*a* placed between the third outer electrode 92*c* and the third inner electrode 94*c* (W1≥W5).

The second width W2 may be equal to or greater than a width W6 (hereinafter, referred to as 'sixth width') of the current blocking layer part 130, which corresponds to the first electrode 94*a* placed between the fourth outer electrode 92*d* and the third inner electrode 94*c* (W2≥W6). Furthermore, the third width W3 may be greater than the fourth width W4 (W3>W4).

The current blocking layer 130 may include an overlap part and a non-overlap part, both of which correspond to the first electrode layer 150 in a vertical direction. Depending upon a clearance with the pad part 102*a* and 102*b*, a width of the non-overlap part of the current blocking layer 130 may be varied. For instance, the width of the non-overlap part of the current blocking layer 130 may increase with decreasing distance to the pad part 102*a* and 102*b*.

A width of a first non-overlap part of the current blocking layer 130, which corresponds to the first area of the electrode part 92*a* to 92*d* and 94*a* to 94*c*, may be greater than a width of a second non-overlap part of the current blocking layer 130, which corresponds to the second area of the electrode part 92*a* to 92*d* and 94*a* to 94*c*. Here, the first area may be closer to first pad 102*a* than the second area.

For instance, a width D11 (hereinafter, referred to as 'first non-overlap width') of a non-overlap part of the current blocking layer 130, which corresponds to the first area of the first outer electrode 92*a*, may be greater than a width D21 (hereinafter, referred to as 'second non-overlap width') of another non-overlap part of the current blocking layer 130, which corresponds to the second area of the first outer electrode 92*a* (D11>D21).

Further, a width D31 (hereinafter, referred to as 'third non-overlap width') of a first non-overlap part of the current block layer 130, which corresponds to the third outer electrode 92*c* placed between the first pad 102*a* and the first inner electrode 94*a* may be greater than a width D41 (hereinafter, referred to as 'fourth non-overlap width') of a third non-overlap part of the current blocking layer 130, which corresponds to the third inner electrode 94*c* placed between the first outer electrode 92*a* and the first inner electrode 94*a* (D31>D41).

The fourth non-overlap width D41 may be equal to or greater than a width D51 (hereinafter, referred to as 'fifth non-overlap width') of a fourth non-overlap part of the current blocking layer 130, which corresponds to the third inner electrode 94*c* placed between the first outer electrode 92*a* and the first inner electrode 94*a* (D41≥D51).

The fifth non-overlap width D51 may be equal to or greater than a width D61 (hereinafter, referred to as 'sixth non-overlap width') of a first overlap part of the current blocking layer 130, which corresponds to the fourth outer electrode 92d placed between the first outer electrode 92a and the first inner electrode 94a (D51≥D61).

In addition, the first non-overlap width D11 may be equal to the third non-overlap width D31 (D11=D31).

The width D13 of the first non-overlap part of the current blocking layer 130, which corresponds to the first pad 102, may be equal to or greater than the first non-overlap width D11 (D13≥D11).

The first non-overlap width D11 may be equal to or greater than a width D71 (hereinafter, referred to as 'seventh non-overlap width') of the third non-overlap part of the current blocking layer 130, which corresponds to the first inner electrode 94a placed between the third outer electrode 92c and the third inner electrode 94c (D11≥D71).

The second non-overlap width D21 may be equal to or greater than a width D81 (hereinafter, referred to as 'eighth non-overlap width') of the third non-overlap part of the current blocking layer 130, which corresponds to the first inner electrode 94a placed between the fourth outer electrode 94d and the third inner electrode 94c (D21≥D81).

Figure 3:
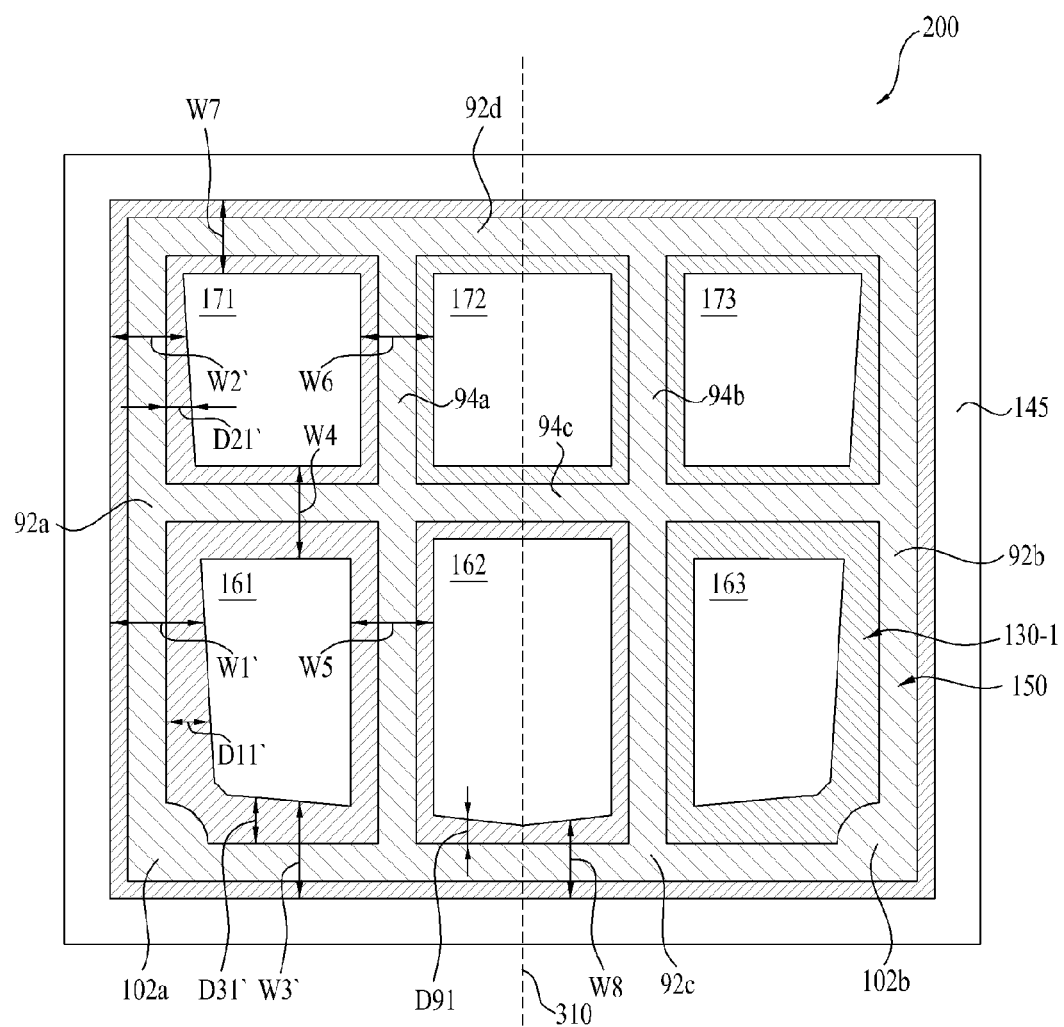
FIG. 3 is a plan view illustrating a light emitting device according to a second embodiment.

FIG. 3 is a plan view illustrating the light emitting device 200 according to a second embodiment. The same reference numerals as shown in FIGS. 1 and 2 indicate substantially the same configurations and, therefore, repeated description will be omitted or briefly mentioned.

Referring to FIG. 3, the width of the current blocking layer 130 corresponding to the electrode part 92a to 92d and 94a to 94c may linearly or non-linearly increase with decreasing distance to the pad part 102a and 102b.

A width of a current blocking layer part 130-1 corresponding to at least a part of the electrode part 92a to 92d and 94a to 94c may linearly or non-linearly increase with decreasing distance to the first pad 102a or second pad 102b.

A width of the current blocking layer part 130-1 corresponding to the first area of the electrode part 92a to 92d and 94a to 94c may linearly or non-linearly increase with decreasing distance to the first pad 102a or second pad 102b.

For instance, the width of the current blocking layer part 130-1 corresponding to the first outer electrode 92a may linearly increase with decreasing distance to the first pad 102a. Also, a width of another part of the current blocking layer part 130 corresponding to the second outer electrode 92b may linearly increase with decreasing distance to the second pad 102b.

A width of a non-overlap part of the current blocking layer 130-1 corresponding to at least a part of the electrode part 92a to 92d and 94 to 94c may linearly or non-linearly increase with decreasing distance to the first pad 102a or second pad 102b.

A width of a non-overlap part of the current blocking layer 130-1 corresponding to the first area of the electrode part 92a to 92d and 94a to 94c may linearly or non-linearly increase with decreasing distance to the first pad 102a or second pad 102b.

Here, for example, the first area of the electrode part 92a to 92d and 94a to 94c may be the first outer electrode part 92a placed between the first pad 102 and the third inner electrode 94c, wherein the width of the current blocking layer part 130-1 is W1' while the width of the non-overlap part of the current blocking layer 130 is D11'.

Also, for example, the first area of the electrode part 92a to 92d and 94a to 94c may be the first outer electrode part 92a placed between the third inner electrode 94c and the fourth outer electrode 92d, wherein the width of the current blocking layer part 130-1 is W2' while the width of the non-overlap part of the current blocking layer is D21'.

Further, for example, the first area of the electrode part 92a to 92d and 94a to 94c may be the third outer electrode part 92c placed between the first pad 102a and the first inner electrode 94a, wherein the width of the current blocking layer part 130-1 is W3' while the width of the non-overlap part of the current blocking layer 130 is D31'.

The first area of the electrode part 92a to 92d and 94a to 94d is the third outer electrode part 92c placed between the first inner electrode 94a and the second inner electrode 94b, wherein the width of the current blocking layer part 130-1 is W8 while the width of the non-overlap part of the current blocking layer 130 is D91, provided that the foregoing widths should be limited to a boundary 310 having the same clearance from the first pad 102a and the second pad 102b, respectively. The current blocking layer 130-1 may be symmetric around the boundary described above.

Figure 4:
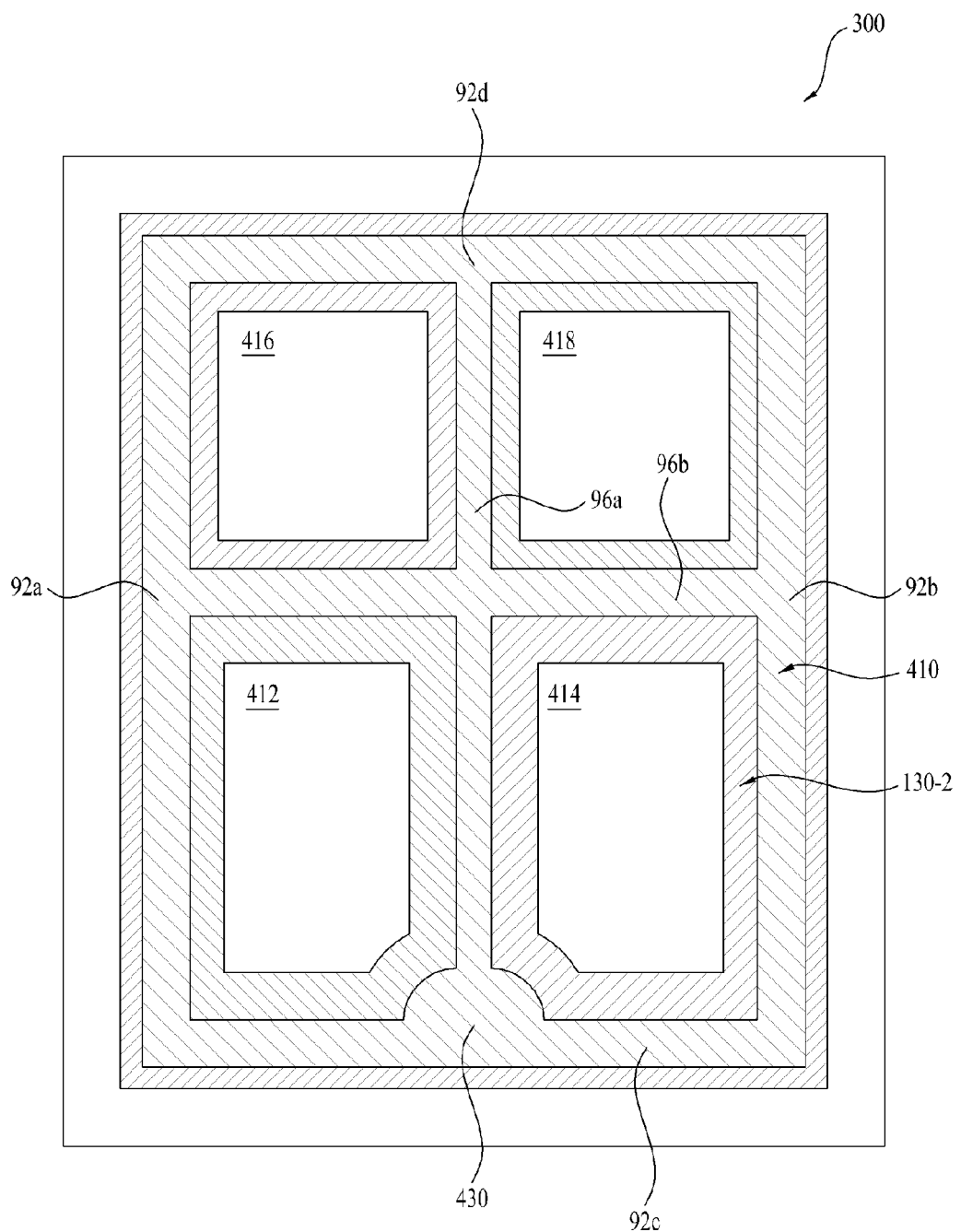
FIG. 4 illustrates a light emitting device according to a third embodiment.

FIG. 4 illustrates the light emitting device 300 according to a third embodiment. The same reference numerals as shown in FIGS. 1 and 2 indicate substantially the same configurations and, therefore, repeated description will be omitted or briefly mentioned. The third embodiment describes a first electrode layer 410 and a current blocking layer 130-2 corresponding thereto, wherein these layers have a pattern different from those described in the first embodiment.

Referring to FIGS. 1, 2 and 4, the first electrode layer 410 in the light emitting device 300 according to the third embodiment may include outer electrodes 92a to 92d and inner electrodes 96a and 96b, while the current blocking layer 130-2 may correspond to the first electrode layer 410 and be arranged between the second conductive semiconductor layer 141 and the second electrode layer 105 (for example, between the ohmic layer 120 and the adhesion layer 113).

The electrode layer 410 may include an electrode part 92a to 92d as well as 96a and 96b and a pad 430 connected to the electrode part 92a to 92d as well as 96a and 96b. The electrode part 92a to 92d as well as 96a and 96b may include the outer electrodes 92a to 92d and the inner electrodes 96a and 96b.

The outer electrodes 92a to 92d may be arranged in a rectangular shape having four sides and four apexes on the light emitting structure 140. The inner electrodes 96a and 96b may be arranged inside the outer electrodes 92a to 92d.

The inner electrodes 96a and 96n substantially comprise a first inner electrode 96a extending in a first direction and a second inner electrode 96b extending in a second direction, and an inner area surrounded by the outer electrodes 92a to 92d may be divided into plural regions 412 to 418.

Contrary to the first embodiment, the pad 430 of the third embodiment may be provided on a part at which any one inner electrode contacts any one of four sides of the outer electrodes 92a to 92d. For example, the pad 430 may be arranged between the third electrode 92c and the first inner electrode 96a and each of the electrode part 92a to 92d as well as 96a and 96b and the current blocking layer 130-2 may be symmetric at right and left sides around the first inner electrode 96a.

As described above, a width of the current blocking layer 130-2 corresponding to a first area of the electrode part 92a to 92d as well as 96a and 96b may be varied depending upon a clearance to the pad 430. A width of the current blocking layer part 130-2 corresponding to a first area of the electrode part 92a to 92d as well as 96a and 96b may be greater than a width of the current blocking layer part 130-2 corresponding to a second area of the electrode part 92a to 92d as well as 96a and 96b. Here, the first area may be closer to the first pad 102a than the second area.

Figure 5:
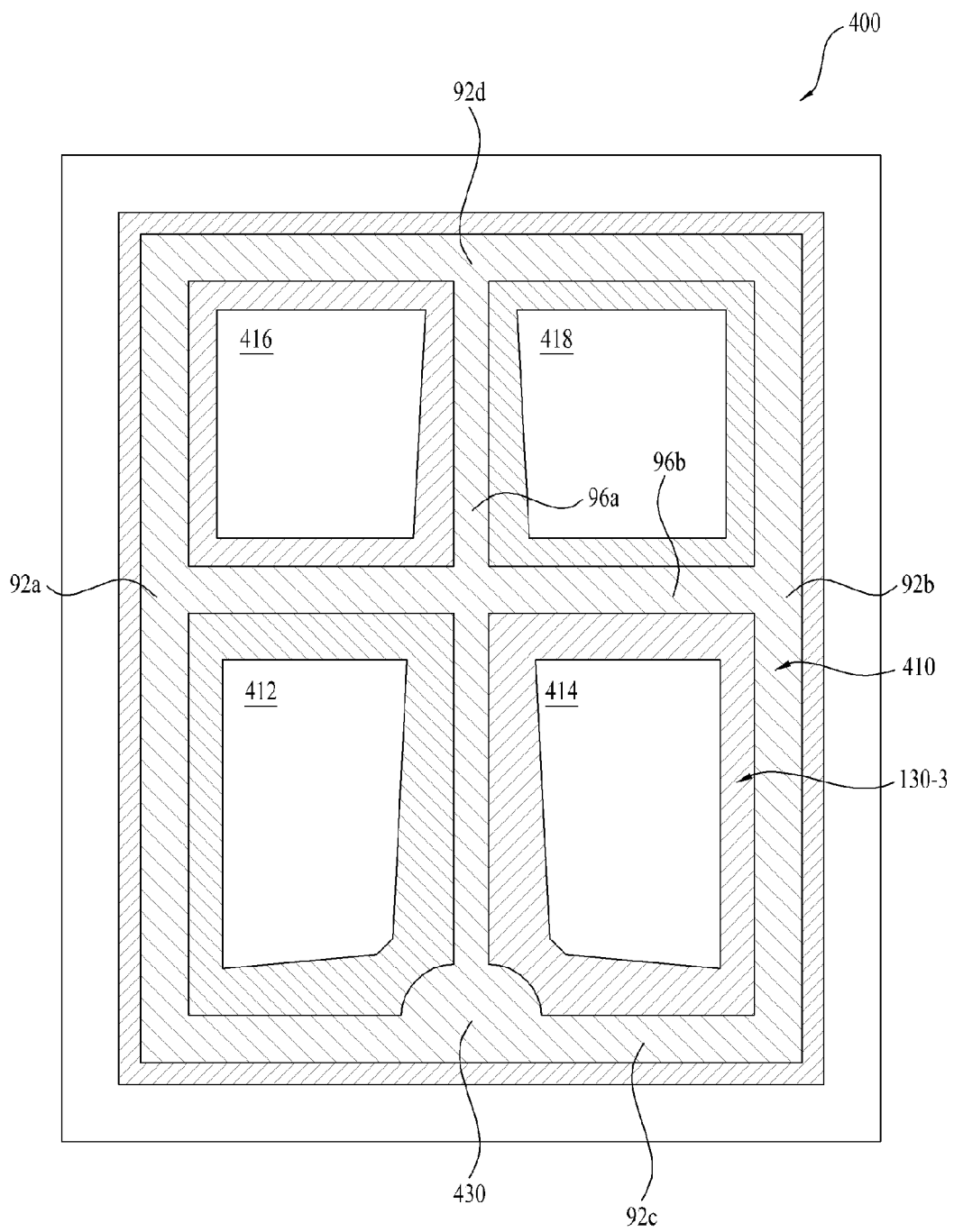
FIG. 5 illustrates a light emitting device according to a fourth embodiment.

FIG. 5 illustrates a light emitting device 400 according to a fourth embodiment.

Referring to FIG. 5, according to the fourth embodiment, a current blocking layer 130-3 has a pattern different from that of the current blocking layer 130-2 described in the third embodiment. A width of the current blocking layer 130-3 may linearly or non-linearly increase with decreasing distance to the pad 430.

A width of the current blocking layer part 130-3 corresponding to at least a part of the electrode part 92a to 92d as well as 96a and 96b may linearly or non-linearly increase with decreasing distance to the pad 430.

Figure 6:
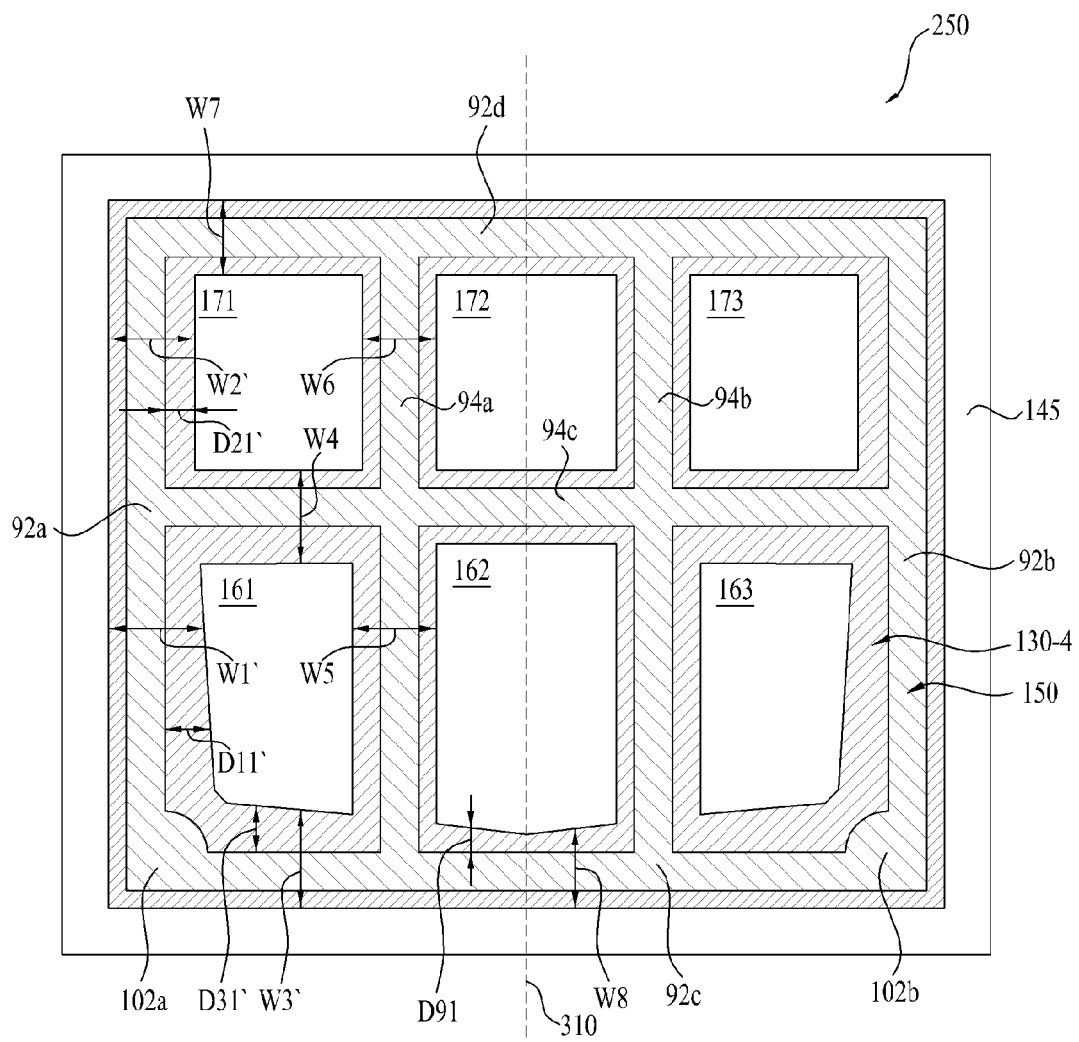
FIG. 6 illustrates a light emitting device according to a fifth embodiment.

FIG. 6 illustrates a light emitting device 250 according to a fifth embodiment. The fifth embodiment describes the same configuration as the second embodiment, except that a current blocking layer 130-4 has a different pattern.

Referring to FIG. 6, first and second areas of the electrode part 92a to 92d and 94a to 94c, which defines a plurality of regions 161 to 163 and 171 to 173, may have different widths.

For example, a width of the current blocking layer 130-4, which corresponds to a first area of the electrode (e.g., 92a) placed on a first region 161, may be greater than a width of the current blocking layer 130-4, which corresponds to a second area of the electrode (e.g., 92a) placed on a fourth region 171. The width of the current blocking layer 130-4 corresponding to the first area may linearly or non-linearly increase with decreasing distance to the pad part (e.g., 102a), while the width of the current blocking layer 130-4 corresponding to the second area may be constant.

Figure 7:
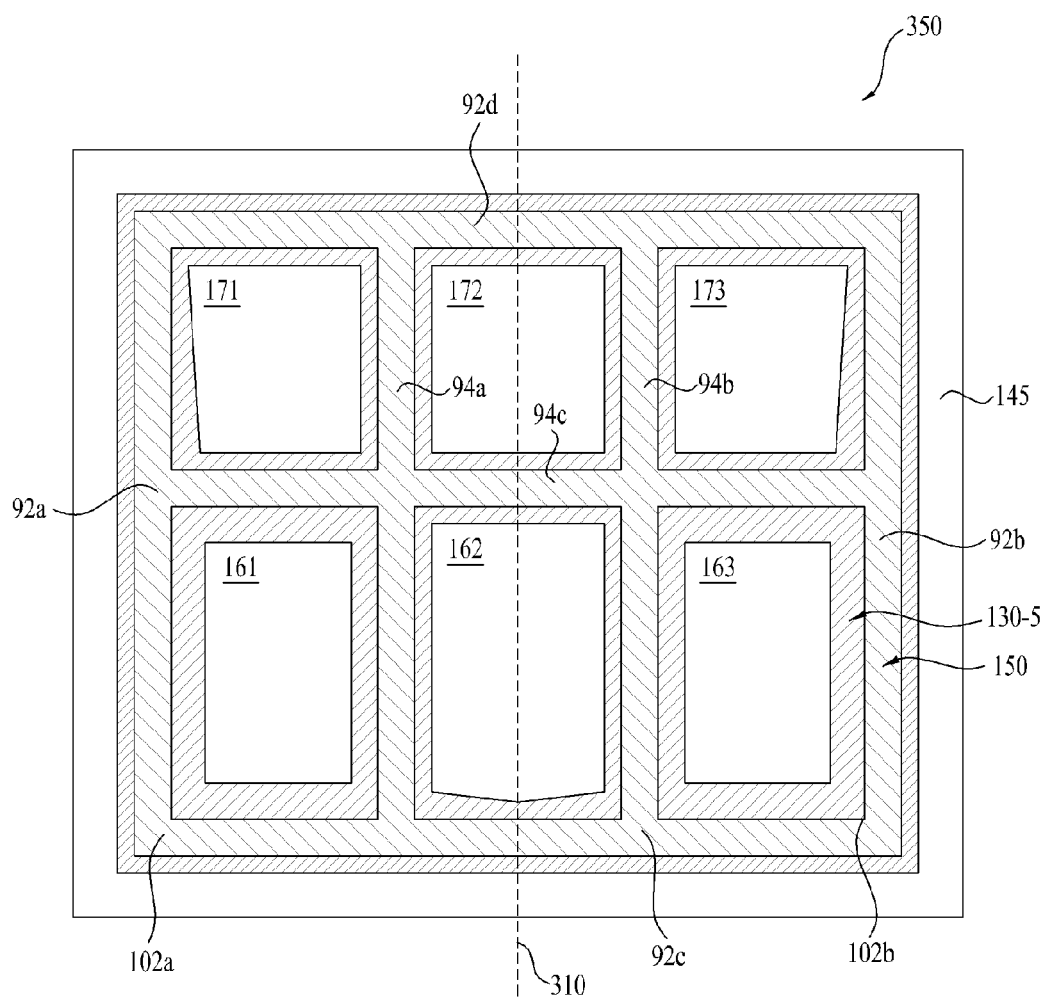
FIG. 7 illustrates a light emitting device according to a sixth embodiment.

FIG. 7 illustrates a light emitting device 350 according to a sixth embodiment. The sixth embodiment describes the same configuration as the second embodiment, except that a current blocking layer 130-5 has a different pattern from that in the first embodiment.

Referring to FIG. 7, a width of the current blocking layer 130-5, which corresponds to a first area of the electrode (e.g., 92a) placed on the first region 161, may be greater than a width of the current blocking layer 130-5, which corresponds to a second area of the electrode (e.g., 92a) placed on the fourth region 171. Although the width of the current blocking layer 130-5 corresponding to the first area is constant, the width of the current blocking layer 130-5 corresponding to the second area may linearly increase with decreasing distance to the pad (e.g., 102a).

Figure 8:
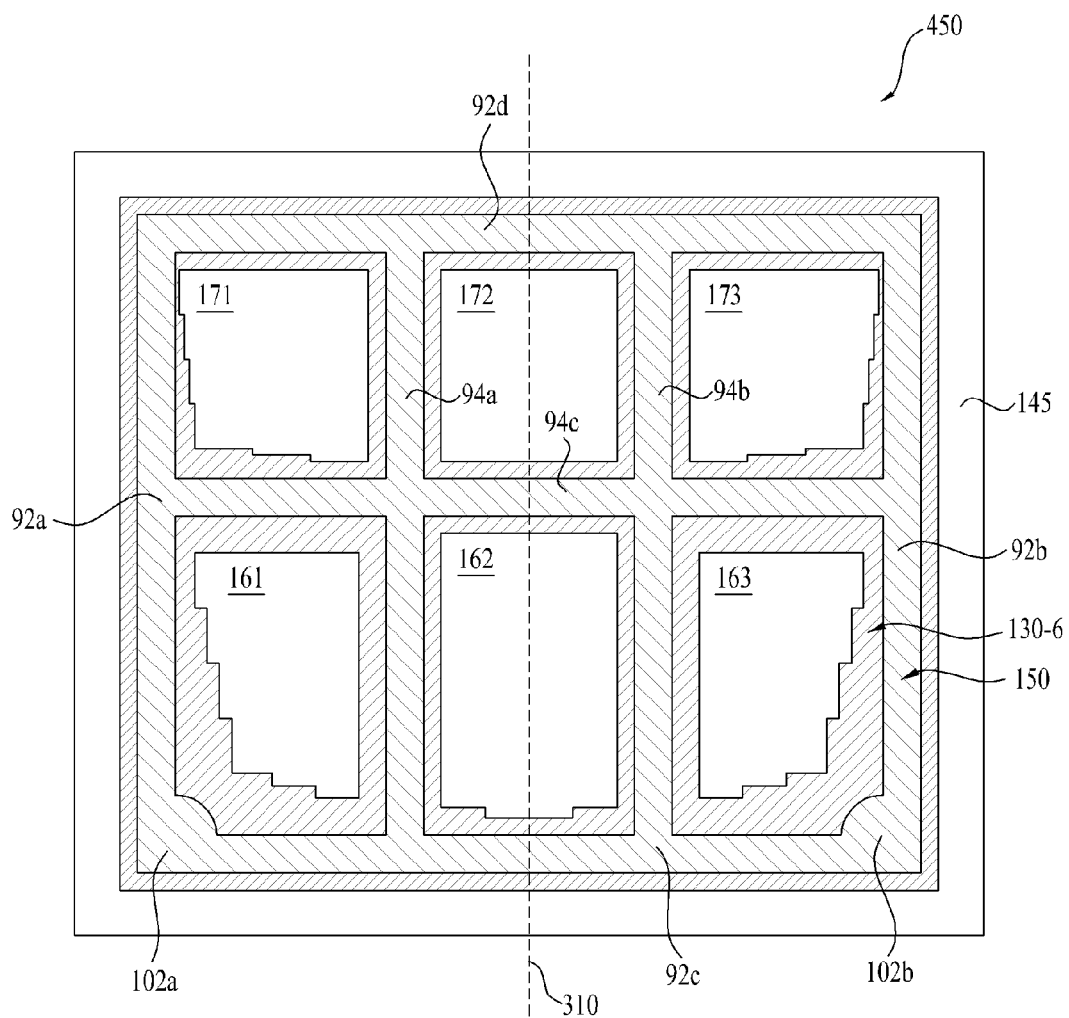
FIG. 8 illustrates a light emitting device according to a seventh embodiment.

FIG. 8 illustrates a light emitting device 450 according to a seventh embodiment. The seventh embodiment describes the same configuration as the first embodiment, except that a current blocking layer 130-6 has a different pattern from that in the first embodiment.

Referring to FIG. 8, as a clearance to the pad part 102a and 102b is reduced, a width of the current blocking layer 130-6 corresponding to the electrode part 92a to 92d and 94a to 94c in a vertical direction may non-linearly increase, for example, may increase stepwise.

In addition, a width of a part of the current blocking layer 130-6, which corresponds to a first area of the electrode part 92a to 92d and 94a to 94c in the vertical direction, may be greater than a width of the other part of the current blocking layer 130-6, which corresponds to a second area of the electrode part 92a to 92d and 94a to 94c in the vertical direction, wherein the width of the current blocking layer 130-6 corresponding to at least one of the first and second areas may increase stepwise with decreasing distance to the pad part 102a and 102b.

Meanwhile, a width of a first non-overlap part of the current blocking layer 130-6, which corresponds to the first area of the electrode part 92a to 92d and 94a to 94c, may be greater than a width of a second non-overlap part of the current blocking layer 130-6, which corresponds to the second area of the electrode part 92a to 92d and 94a to 94c, wherein at least one of the first and second non-overlap parts may increase stepwise with decreasing distance to the pad part 102a and 102b.

Here, the first area of the electrode part 92a to 92d and 94a to 94c may be closer to the pad part 102a and 102b than the second area thereof.

According to embodiments described herein, by varying a width of the current blocking layer 130 or each of 130-1 to 130-6 between a region having higher current crowding and another region having relatively lower current crowding, such current crowding in the electrode part adjacent to the pad part 102a, 102b or 430 may be prevented, thus enabling uniform current density and ultimately enhancing luminous efficiency and reliability of the light emitting device.

For example, by increasing the width of the current blocking layer 130 or each of 130-1 to 130-6 corresponding to the electrode part adjacent to the pad part 102a, 102b or 430 while decreasing the width of the current blocking layer 130 or each of 130-1 to 130-6 corresponding to the electrode part apart from the pad part 102a, 102b or 430, dispersion (or distribution) of current concentrated to the electrode part adjacent to the pad part 102a, 102b or 430 may be improved.

Figure 9:
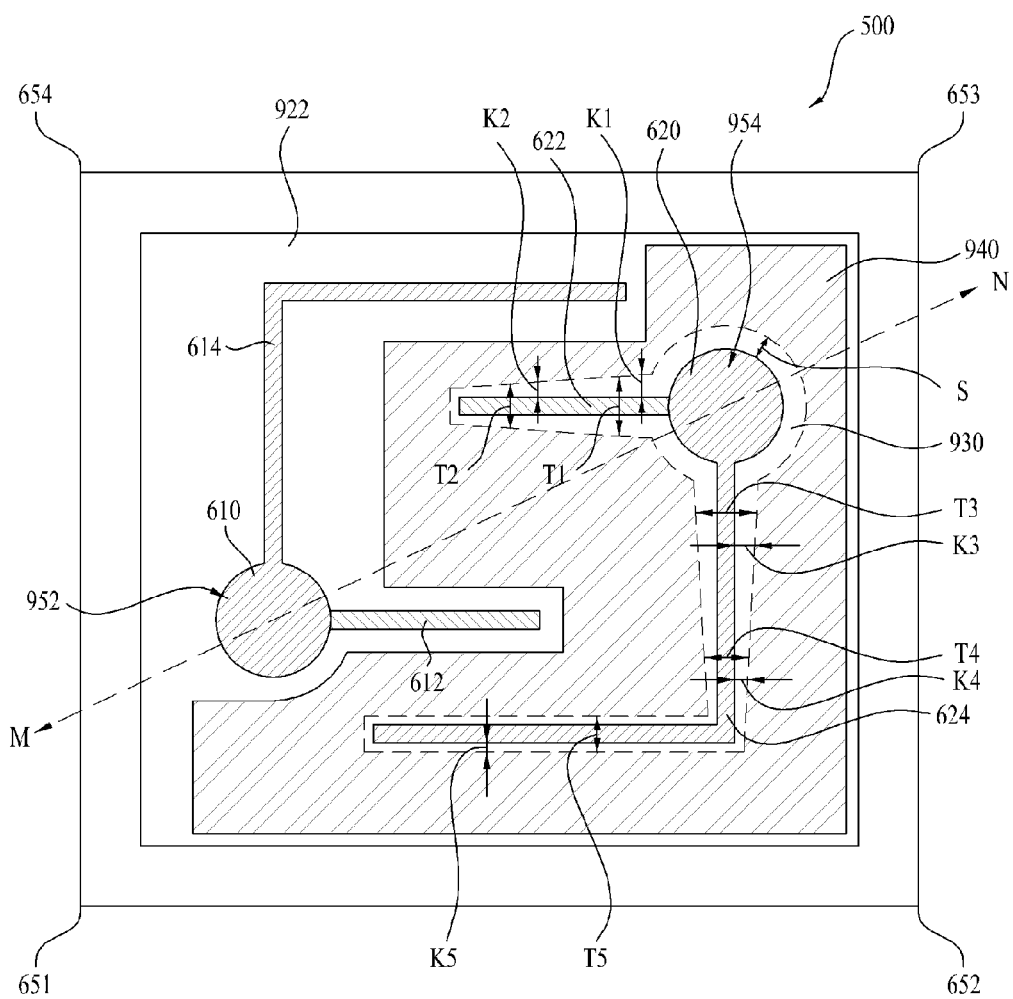
FIG. 9 is a plan view illustrating a light emitting device according to an eighth embodiment.
Figure 10:
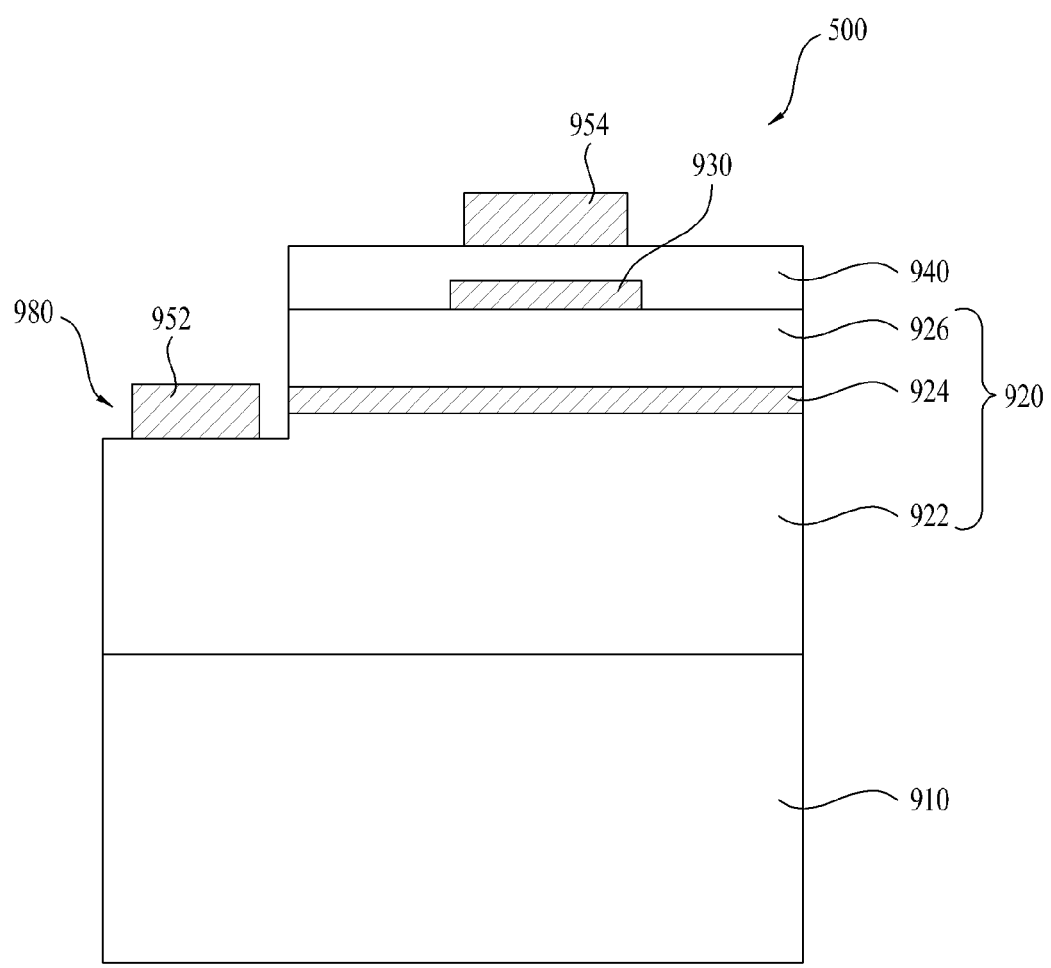
FIG. 10 is a cross-sectional view taken in the direction M-N of the light emitting device shown in FIG. 9.

FIG. 9 is a plan view illustrating a light emitting device 500 according to an eighth embodiment, and FIG. 10 is a cross-sectional view taken in the direction M-N of the light emitting device 500 shown in FIG. 9. Referring to FIGS. 9 and 10, the light emitting device 500 includes a substrate 910, a light emitting structure 920, a current blocking layer 930, a conductive layer 940, a first electrode 952 and a second electrode 954.

The substrate 910 may be any one selected from a sapphire, silicon (Si), zinc oxide (ZnO) or nitride semiconductor substrate or, otherwise, a template substrate formed by laminating at least one selected from GaN, InGaN, AlGaN, AlInGaN or InAlGaN.

The light emitting structure 920 may include a first conductive semiconductor layer 922, an active layer 924 and a second conductive semiconductor layer 926. For example, the light emitting structure may have a multi-layered structure formed by laminating the first conductive semiconductor layer 922, the active layer 924 and the second conductive semiconductor layer 926 on the substrate 910.

In this regard, an undoped semiconductor layer (not shown, i.e., undoped GaN) may be interposed between the substrate 910 and the first conductive semiconductor layer 922. Here, the first conductive semiconductor layer may be an N-type layer while the second conductive semiconductor layer is a P-type layer. The first conductive semiconductor layer 922, active layer 924 and second conductive semiconductor layer 926 may be the same as explained in FIG. 2.

The light emitting structure 920 may be formed in a structure wherein the second conductive semiconductor layer 926, the active layer 924 and a part of the first conductive semiconductor layer 922 are etched to expose a part of the first conductive semiconductor layer 922. In this case, such etching that partially exposes the first conductive semiconductor layer 922 refers to 'mesa etching' and the part of the first conductive semiconductor layer 922 exposed through the mesa etching refers to an etched region 980 which is positioned at a lower site than the active layer 924.

The current blocking layer 930 may be provided on the second conductive semiconductor layer 926. The current blocking layer 930 may prevent current crowding on a part of the active layer 924 while allowing current to widely flow throughout the light emitting structure 920. Therefore, the light emitting device 500 can be driven with stable operate voltage and a luminous intensity of the light emitting device 500 may be enhanced.

The current blocking layer 930 may be formed using any insulating material such as an oxide layer, in order to block current flow. For instance, the current blocking layer 930 may be formed of at least one selected from $SiO_2$, $SiN_X$, $TiO_2$, $Ta_2O_3$, SiON or SiCN.

The conductive layer 940 may be arranged on the second conductive semiconductor layer 926 and the current blocking layer 930. In particular, the conductive layer 940 may be arranged on the second conductive semiconductor layer 926 that is not etched by mesa etching. The conductive layer 940 may reduce total reflection while having excellent light transmission, thereby improving light extraction efficiency of the light emitted from the active layer 924 to the second conductive semiconductor layer 926. The conductive layer 940 may comprise a transparent conductive oxide layer. For instance, the conductive layer 940 may be composed of at least one material selected from indium tin oxide (ITO), tin oxide (TO), indium zinc oxide (IZO), indium tin zinc oxide (ITZO) and zinc oxide (ZnO).

The first electrode 952 may be arranged on a first etched region 980 of the first conductive semiconductor layer 922. The second electrode 954 may be arranged on the conductive layer 940. That is, the second electrode 954 and the current blocking layer 940 may overlap each other in a vertical direction. More particularly, at least a part of the current blocking layer 940 may overlap with the second electrode 954 in a vertical direction. Here, the vertical direction may be a direction from the second conductive semiconductor layer 926 to the first conductive semiconductor layer 922.

The first and second electrodes 952 and 954 may be formed using at least one selected from titanium (Ti), chromium (Cr), nickel (Ni), aluminum (Al), platinum (Pt) and gold (Au).

The first electrode 952 may include a first pad 610 and at least one expanded electrode part 612 and 614 branched from the first pad 610. The expanded electrode part 612 and 614 may have a first expanded electrode 612 and a second expanded electrode 614 which are branched in different directions.

The first pad 610 is provided on one area of the first conductive semiconductor layer 922, and the first expanded electrode 612 is expanded from one side of the first pad 610 in a third direction while the second expanded electrode 614 may be expanded from the other side of the first pad 610 in a fourth direction and then change the direction toward the third direction.

The second electrode 954 may include a second pad 620 and at least one expanded electrode part 622 and 624 branched from the second pad 620. The expanded electrode part 622 and 624 may have a third expanded electrode 622 and a fourth expanded electrode 624 which are branched in different directions.

The second pad 620 is provided on one area of the conductive layer 940, and the third expanded electrode 622 is expanded from one side of the second pad 620 in a fifth direction while the fourth expanded electrode 624 may be expanded from the other side of the second pad 620 in a sixth direction and then change the direction toward the fifth direction.

In this regard, the third direction may be a direction from any one edge 651 of the light emitting device 500 to another edge 652 thereof and the fourth direction may be a direction from the edge 651 to another edge 654 of the light emitting device 500, wherein the third and fourth directions may be perpendicular to each other. On the other hand, the fifth direction may be an opposite direction of the third direction while the sixth direction is an opposite direction of the fourth direction.

The current blocking layer 930 may be provided on the second conductive semiconductor layer 926 and have an overlap part and a non-overlap part, which correspond to the second electrode 954 in a vertical direction. That is, the current blocking layer 940 may have an overlapping part (hereinafter, referred to as 'overlap part') and a non-overlapping part (hereinafter, referred to as 'non-overlap part') which correspond respectively to the second pad 620, third expanded electrode 622 and fourth expanded electrode 624.

A width of the current blocking layer 930 corresponding to at least one expanded electrode part 622 and 624 in a vertical direction may be varied depending upon a clearance with the second pad 620. That is, as the clearance with the second pad 620 is decreased, the width of the current blocking layer 930 corresponding to at least one expanded electrode part 622 and 624 may linearly or non-linearly increase.

A width of the current blocking layer part 930 corresponding to each of the third expanded electrode 622 and the fourth expanded electrode 624 may linearly or non-linearly increase with decreasing distance to the second pad 620.

For instance, a width of the current blocking layer part 930 corresponding to the third expanded electrode 622 may increase with decreasing distance to an opposite direction of the expanding direction (i.e., the fifth direction) (T2<T1). Likewise, a width of the current blocking layer 930 corresponding to the fourth expanded electrode 624 may increase with decreasing distance to an opposite direction of the expanding direction (T5<T4<T3).

A width of the non-overlap part of the current blocking layer 930, which corresponds to each of the third expanded electrode 622 and the fourth expanded electrode 624 may linearly or non-linearly increase with decreasing distance to the second pad 620.

For instance, a width K1 of the non-overlap part of the current blocking layer 930 corresponding to the third expanded electrode 622 may increase with decreasing distance to an opposite direction of the expanding direction (i.e., the fifth direction) (K2<K1). Likewise, a width of the non-overlap part of the current blocking layer 930 corresponding to the fourth expanded electrode 624 may increase with decreasing distance to an opposite direction of the expanding direction (K5<K4<K3).

Further, a width S of the non-overlap part of the current blocking layer 930 corresponding to the second pad 620 may be grater than a width of the non-overlap part of the current blocking layer 930 corresponding to the third expanded electrode 622 and the fourth expanded electrode 624, respectively (K1<S, K3<S).

As described above, the eighth embodiment describes that a current density of the light emitting device may be uniformized by increasing a width of the current blocking layer corresponding the electrode part with decreasing distance to a second pad, thereby improving luminous efficiency and reliability of the light emitting device.

Figure 11:
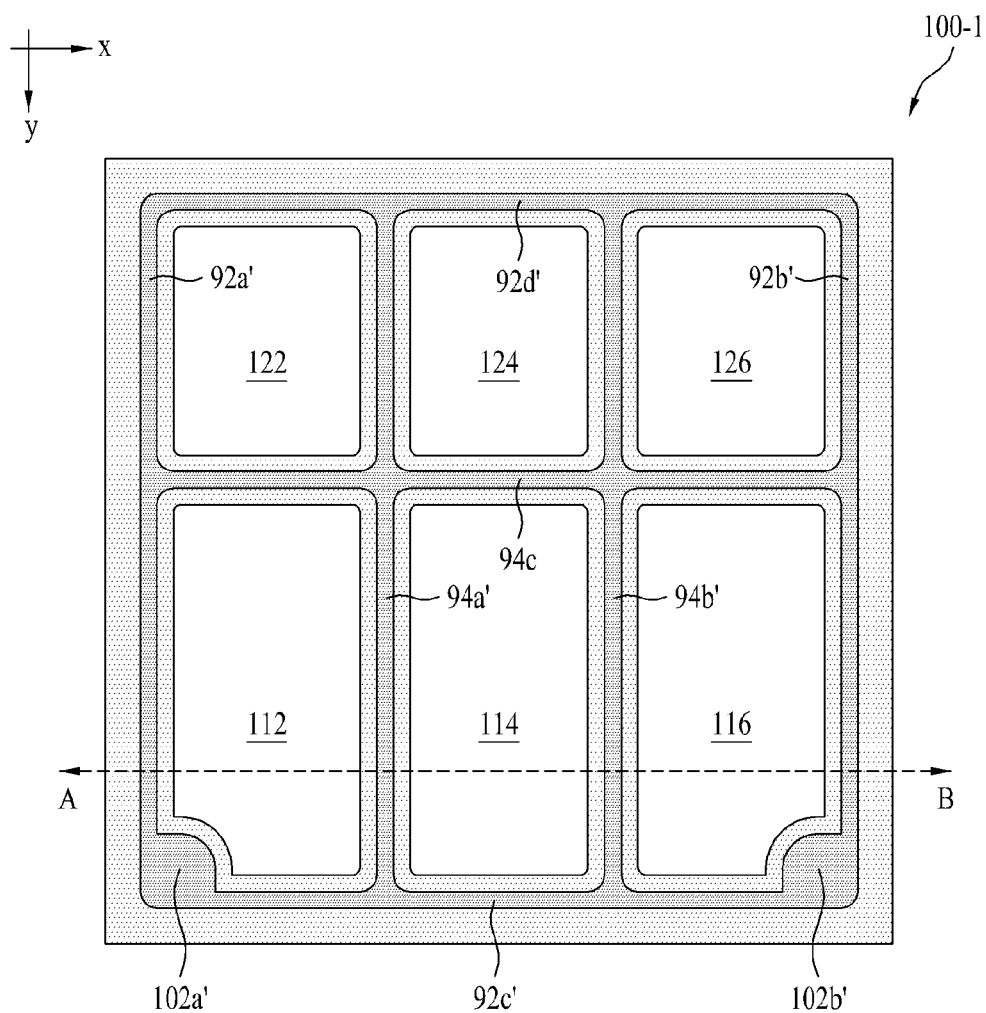
FIG. 11 is a plan view illustrating a light emitting device according to a ninth embodiment.
Figure 12:
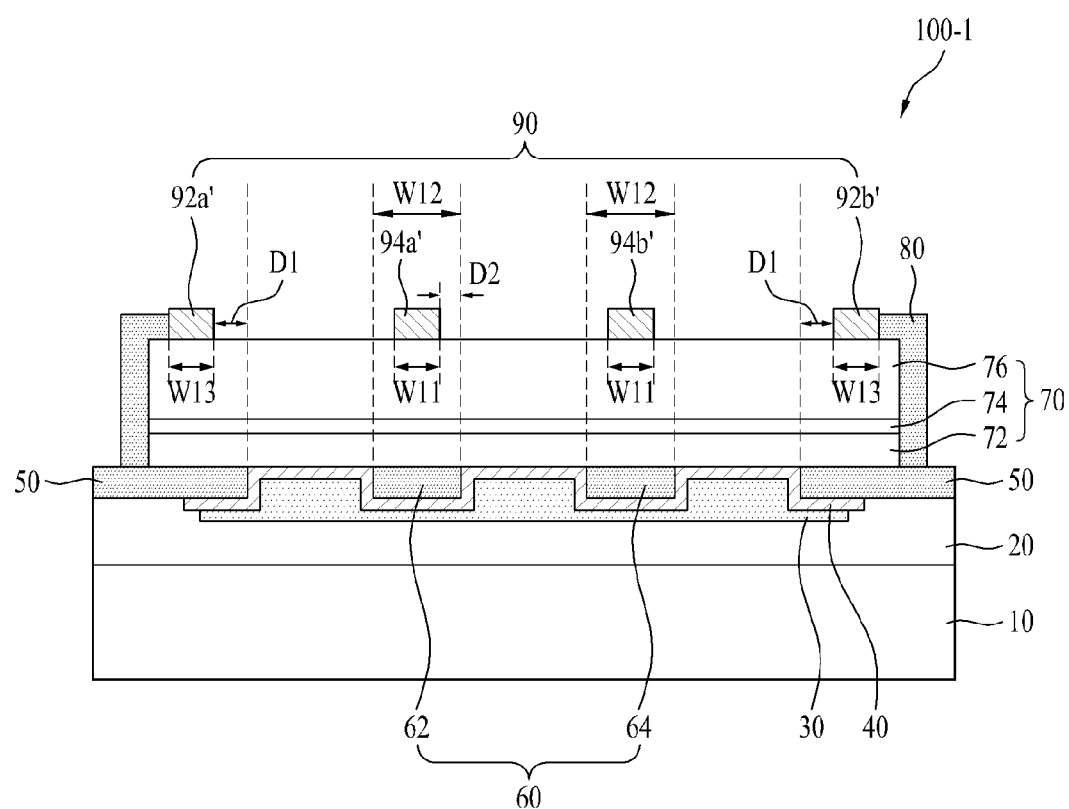
FIG. 12 is a cross-sectional view taken in the direction A-B of the light emitting device shown in FIG. 11.

FIG. 11 is a plan view illustrating a light emitting device according to a ninth embodiment and FIG. 12 is a cross-sectional view taken in the direction A-B of the light emitting device shown in FIG. 11.

Referring to FIGS. 11 and 12, a light emitting device 100-1 may include a (support) substrate 10, an adhesion layer 20, a reflective layer 30, an ohmic contact layer 40, a protective layer 50, a current blocking layer 62 or 64, a light emitting structure 70, a passivation layer 80 and an electrode 90.

The substrate 10 may support the light emitting structure 70 and be operated together with the electrode 90 to supply power to the light emitting structure 70. The adhesion layer 20 may be provided on the substrate 10 while the reflective layer 30 may be provided above the adhesion layer 20. In addition, the ohmic contact layer 40 may be arranged on the reflective layer 30.

The substrate 10, adhesion layer 20, reflective layer 30 and ohmic contact layer 40 may be combined to form a second electrode layer. The substrate 10, adhesion layer 20, reflective layer 30 and ohmic contact layer 40 shown in FIG. 12 may be substantially the same as the substrate 110, adhesion layer 113, reflective layer 115 and ohmic layer 120 explained in FIG. 2.

The current blocking layers 62 and 64 may be arranged between the ohmic contact layer 40 and the light emitting structure 70. A top side of the current blocking layers 62 and 64 may contact a second conductive semiconductor layer 72 described below, while bottom and lateral sides of the current blocking layers 62 and 64 may contact the ohmic contact layer 40.

Each of the current blocking layers 62 and 64 may be arranged between the ohmic contact layer 40 and the second conductive semiconductor layer 72 in such a way that a part of the current blocking layer overlaps with the electrode 90 described below. A material for the current blocking layers 62 and 64 may be substantially the same as that used for the current blocking layer 130 shown in FIG. 2.

The protective layer 50 may be provided at a periphery of the adhesion layer 20. If the adhesion layer 50 is not provided, the protective layer 50 may be positioned at a periphery of the substrate 10.

The light emitting structure 70 may include a second conductive semiconductor layer 72, an active layer 74 and a first conductive semiconductor layer 76 and be arranged on the ohmic contact layer 40 and the protective layer 50. The light emitting structure 70 may at least partially overlap with the protective layer 50 in a vertical direction. Also, a partial area of the protective layer 50 may overlap with the light emitting structure 70, while the other area thereof may not overlap with the light emitting structure 70. The vertical direction may refer to a direction from the second conductive semiconductor layer 141 to the first conductive semiconductor layer 143. The light emitting structure 70 may be substantially the same as the light emitting structure 140 explained in FIG. 2.

The electrode 90 may be provided on the top side of the light emitting structure 70. The electrode 90 may include outer electrodes 92a' to 92d' extending along a periphery of the first conductive semiconductor layer 76, inner electrodes 94a' to 94c' placed in the outer electrodes 92a' to 92d', and a pad part 102a' and 102b'. The outer electrodes 92a' to 92d', the inner electrodes 94a' to 94c' and the pad part 102a' and 102'b may be substantially the same as the first conductive layer 150 explained in FIG. 2.

At least a part of the electrode 90 may overlap with the protective layer 50 and the current blocking layer 60. For example, the outer electrodes 92a' to 92d' may overlap with the protective layer 50 in a vertical direction, while the inner electrodes 94a' to 94c' may overlap with the current blocking layer 60 in a vertical direction.

A width W13 of each of the outer electrodes 92a' to 92d' may be equal to or greater than a width w11 of each of the inner electrodes 94a' to 94c' (W13≥W11).

Further, a width of the protective layer 50 may be greater than the width W13 of each of the outer electrodes 92a' to 92d' which overlaps to correspond to the protective layer, while a width W12 of each of the current blocking layers 62 and 64 may be greater than the width W11 of each of the inner electrodes 94a' to 94c' which overlaps to correspond to the current blocking layer.

One side of the outer electrodes 92a' to 92d' may contact a passivation layer 80 described below.

The protective layer 50 may extend toward the other side of the outer electrodes 92a' to 92d', which in turn, has a part not overlapped with the outer electrodes 92a' to 92d'. In this case, the one side is the outside of the light emitting device 100-1 explained in FIG. 1 while the other side indicates the inside of the light emitting device 100-1.

A width D1 of the part of the protective layer 50, which extends toward the other side of the outer electrodes 92a' to 92d' and does not overlap with the outer electrodes 92a' to 92d', may range from 5 to 350% of the width W13 of each of the outer electrodes 92a' to 92d' (D1=k×W13, k=0.05 to 3.5).

The current blocking layers 62 and 64 have non-overlap parts in both side directions of the inner electrodes 94a' to 94c'. The center of the current blocking layers 62 and 64 may be aligned with the center of the current blocking layers 62 and 64 overlapping with the inner electrodes 94a' to 94c'. Hereinafter, the center of the current blocking layers 62 and 64 is referred to as a 'first center' while the center of the inner electrodes 94a' to 94c' is referred to as a 'second center.' That is, a straight line through the first center and the second center may be perpendicular to the substrate 10.

Since the width W12 of each of the current blocking layers 62 and 64 is greater than the width W11 of each of the inner electrodes 94a' to 94c', the current blocking layers 62 and 64 having the center aligned with the center of the inner electrodes 94a' to 94c' may have non-overlap parts in both side directions of the inner electrodes 94a' to 94c'.

In this regard, a width D2 of each of the non-overlap parts of the current blocking layers 62 and 64 in the both side directions of the inner electrodes 94a' to 94c' may range from 5 to 350% of the width W11 of each of the inner electrodes 94a' to 94c' (D2=k×W11, k=0.05 to 3.5).

The width D1 of the non-overlap part of the protective layer 50 to each of the outer electrodes 92a' to 92d' may be equal or not equal to the width D2 of each of the current blocking layers 62 and 64 which are under a non-overlap state in the both side directions of the inner electrodes 94a' to 94c' (D1≠D2).

In this regard, the non-overlap part of the current blocking layer 62 or 64 in one side direction of the inner electrodes 94a' to 94c' is referred to as a 'first area' while the non-overlap part of the current blocking layer 62 or 64 in the other side direction of the inner electrodes 94a' to 94c' is referred to as a 'second area'.

Here, the first area and second area may have the same width. The width of each of the first and second areas may range from 5 to 350%, for example, of the width W11 of each of the inner electrodes 94a' to 94c'.

Since the non-overlap parts of the protective layer 50 to the outer electrodes 92a' to 92d' in the other side direction of the outer electrodes 92a' to 92d', as well as the non-overlap parts of the current blocking layers 62 and 64 to the inner electrodes 94a' to 94c' in both side directions of the inner electrodes 94a' to 94c' are defined as described above, luminous efficiency of the light emitting structure 70 may be enhanced.

The passivation layer 80 may be provided at a lateral side of the light emitting structure 70. The passivation layer 80 may be substantially the same as the passivation layer 145 shown in FIG. 2.

Figure 13:
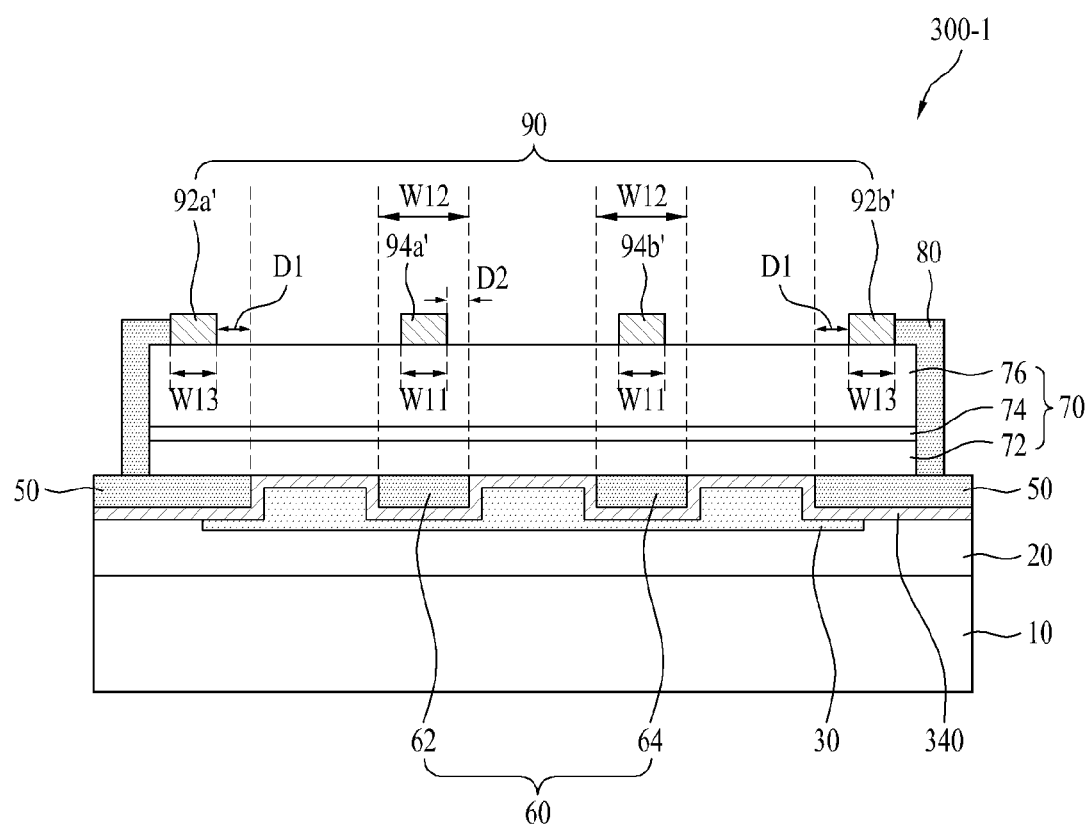
FIG. 13 is a cross-sectional view illustrating a light emitting device according to a tenth embodiment.

FIG. 13 is a cross-sectional view illustrating a light emitting device 300-1 according to a tenth embodiment. Referring to FIG. 13, the light emitting device 300-1 has a similar configuration to the light emitting device 100-1 shown in FIG. 12. A difference is as follows: an ohmic contact layer 340 of the light emitting device 100-1 covers a part of the bottom side of a protective layer 50, while an ohmic contact layer 340 of the light emitting device 300-1 extends to thoroughly cover the bottom side of a protective layer 50. That is, the ohmic contact layer 340 may be arranged to contact the bottom and lateral sides of the protective layer 50, and the protective layer 50 and the adhesion layer 20 may be separated from each other by the ohmic contact layer 340.

Figure 14:
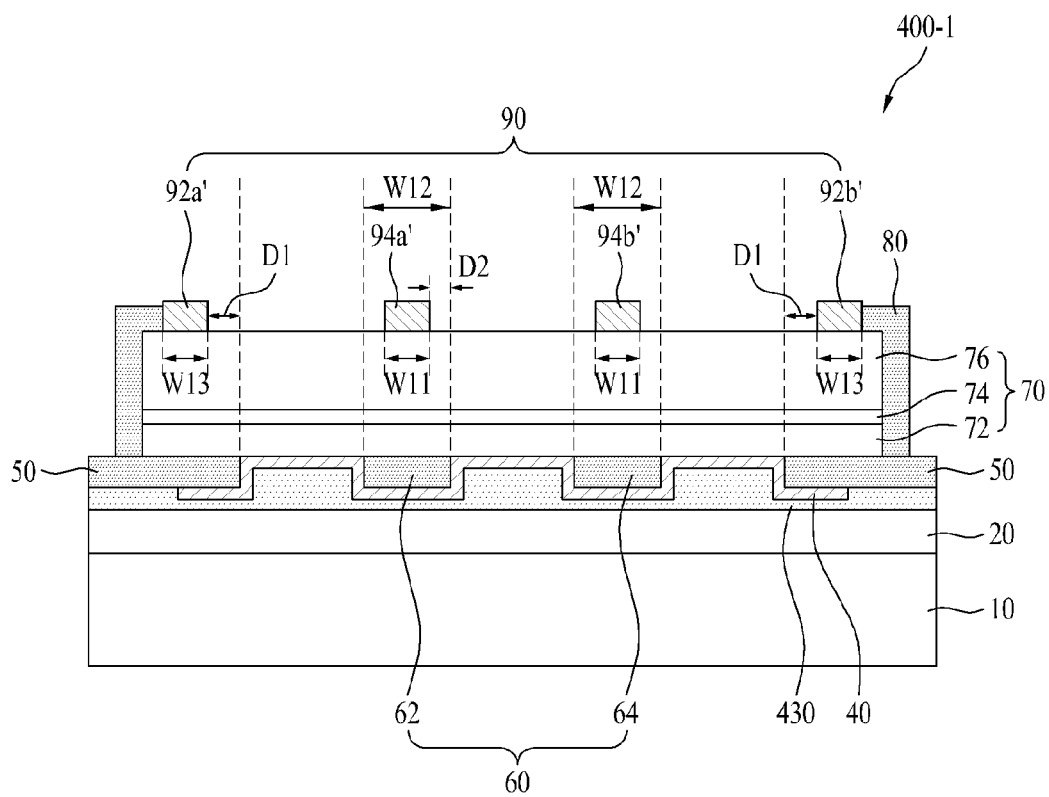
FIG. 14 is a cross-sectional view illustrating a light emitting device according to an eleventh embodiment.

FIG. 14 is a cross-sectional view illustrating a light emitting device 400-1 according to an eleventh embodiment. Referring to FIG. 14, the light emitting device 400-1 has a similar configuration to the light emitting device 100-1 shown in FIG. 12. A difference is as follows: a reflective layer 30 of the light emitting device 100-1 does not contact the bottom side of a protective layer 50, while a reflective layer 430 of the light emitting device 400-1 is arranged to contact the bottom side of a protective layer 50 and an ohmic contact layer 40 and the protective layer 50 and an adhesion layer 20 may be separated from each other by the reflective layer 430.

The light emitting device 400-1 having the reflective layer 430 arranged throughout the top side of the adhesion layer 20 may effectively reflect light emitted from an active layer 74 to thereby improve luminous efficiency, compared to the light emitting device 100-1 shown in FIG. 2. According to other embodiments, the ohmic contact layer and reflective layer may extend below a lateral side of the light emitting device.

FIGS. 15 to 23 illustrate a process of preparing a light emitting device according to one embodiment. The same parts as described in FIGS. 11 and 12 are indicated with the same reference numerals and a detailed description thereof will be omitted.

Figure 15:
FIGS. 15 to 23 illustrates a process of preparing a light emitting device according to one embodiment.

Referring to FIG. 15, a (growth) substrate 510 may have a light emitting structure 515, including; a first conductive semiconductor layer 76, an active layer 72 and a second conductive semiconductor layer 72. The growth substrate 510 may be substantially the same as the substrate 910 shown in FIG. 10.

The light emitting structure 515 may be fabricated by conventional methods, for example; metal organic chemical vapor deposition (MOCVD), chemical vapor deposition (CVD), plasma-enhanced chemical vapor deposition (PECVD), molecular beam epitaxy (MBE), hydride vapor phase epitaxy (HYPE), and so forth, however, the method is not particularly limited thereto.

In order to reduce lattice mismatch, a buffer layer (not shown) and/or an undoped nitride layer (not shown) may be formed between the light emitting structure 515 and the growth substrate 510.

Figure 16:
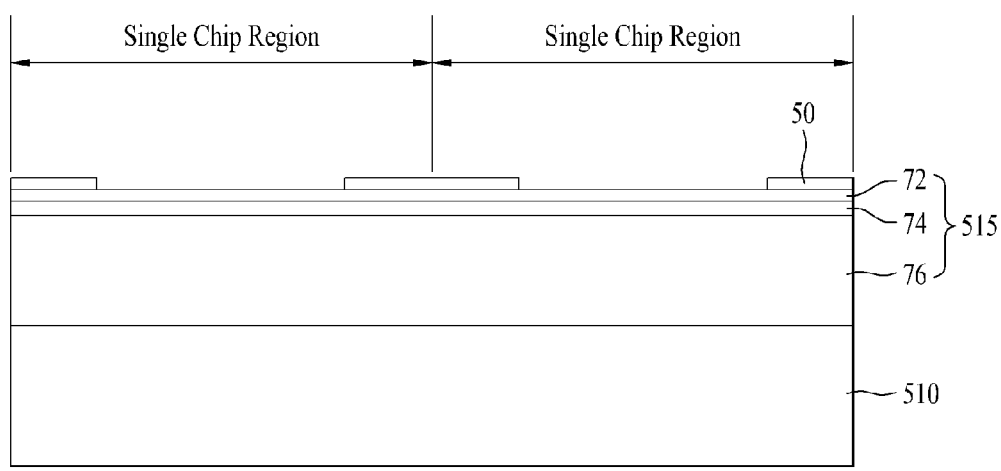

Referring to FIG. 16, a patterned protective layer 50 may be provided on the light emitting structure 515 to distinguish single chip regions. Here, a single chip region means a region divided into individual single chips and acting as such individual single chips.

The protective layer 50 may be formed at a periphery of the single chip region, using a mask pattern. The protective layer 50 may be formed by a variety of deposition processes.

Figure 17:
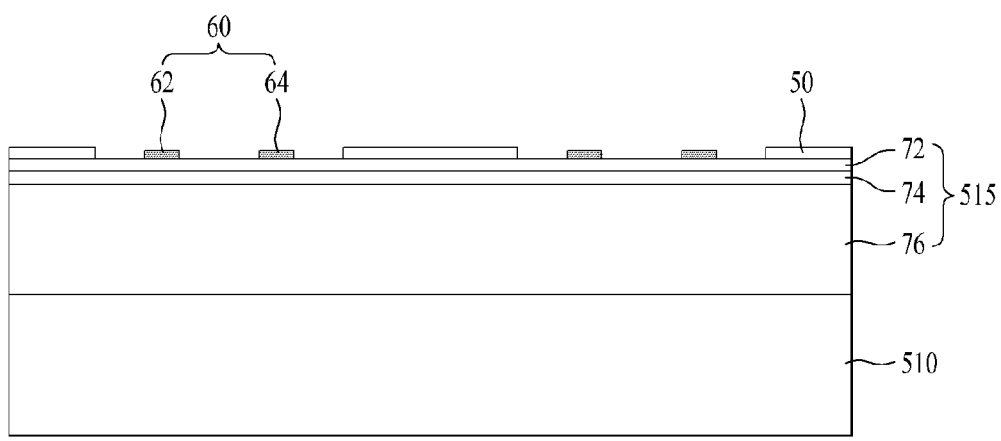

Next, referring to FIG. 17, a current blocking layer 60 is provided on a surface of the second conductive semiconductor layer 72 exposed by the protective layer 50. For example, after forming a SiO$_2$ layer on the second conductive semiconductor layer 72, the mask pattern may be used to form the current blocking layer 60.

In the case where the protective layer 50 is formed as a non-conductive protection layer, the protective layer 50 and the current blocking layer 60 may be composed of the same material. In this case, after forming a SiO$_2$ layer on the second conductive semiconductor layer 72, using only a mask pattern may simultaneously form the current blocking layer 60 as well as the protective layer 50.

Figure 18:
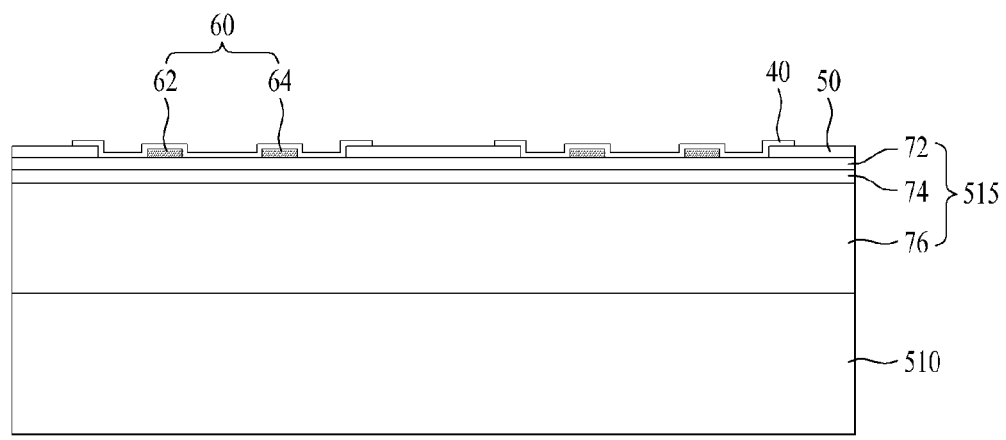
Figure 19:
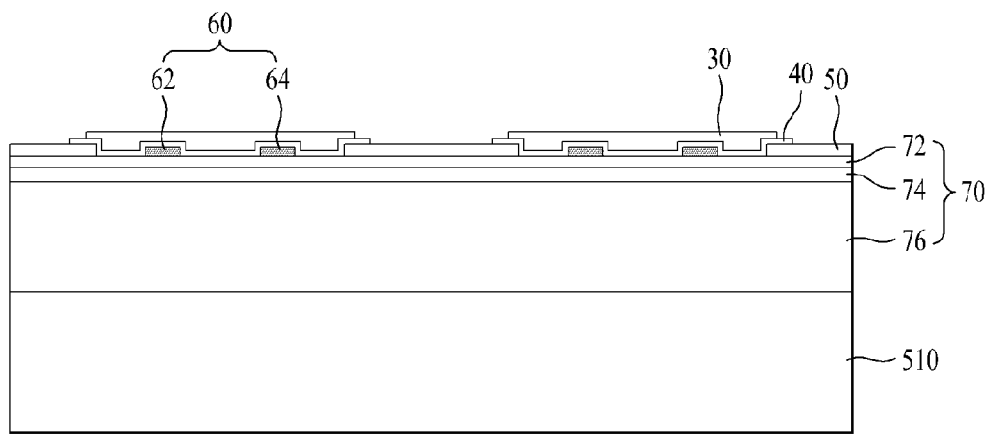

Subsequently, as shown in FIG. 18, an ohmic contact layer 40 is provided on the second conductive semiconductor layer 72 and the current blocking layer 60. Following this, as shown in FIG. 19, a reflective layer 30 may be provided on the ohmic contact layer 40.

When the protective layer 50 is formed as a conductive protection layer, the ohmic contact layer 40 and the protective layer 50 may be composed of the same material. In this case, after forming the current blocking layer 60 on the second conductive semiconductor layer 72, the protective layer 40 and the ohmic contact layer 50 may be simultaneously formed thereon.

The ohmic contact layer 40 and the reflective layer 30 may be formed by any one method selected from electron beam deposition, sputtering or plasma enhanced chemical vapor deposition (PECVD). An area on which the ohmic contact layer 40 and the reflective layer 30 are provided may be variously selected. Depending upon the area on which the ohmic contact layer 40 and/or the reflective layer 30 are (is) provided, the foregoing embodiments illustrated in FIGS. 12 to 14 may be suitably embodied.

Figure 20:
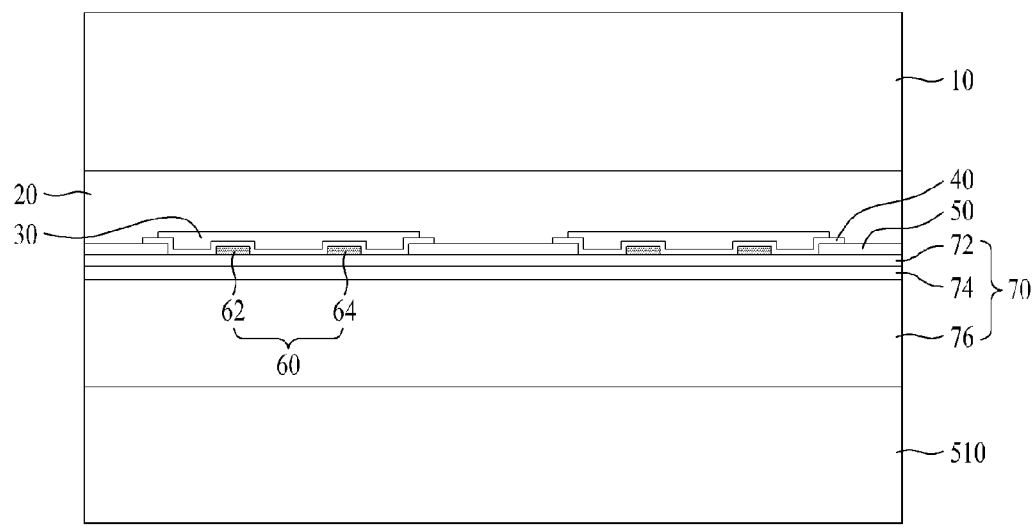

Then, as shown in FIG. 20, a (support) substrate 10 may be provided on the reflective layer 30 and the protective layer 50 by interposing an adhesion layer 20 therebetween.

The substrate 10 is attached to the adhesion layer 20. Although the embodiment describes that the substrate 10 is bonded to the foregoing layers, using the adhesion layer 20, the substrate 10 may also be formed by plating or deposition.

Figure 21:
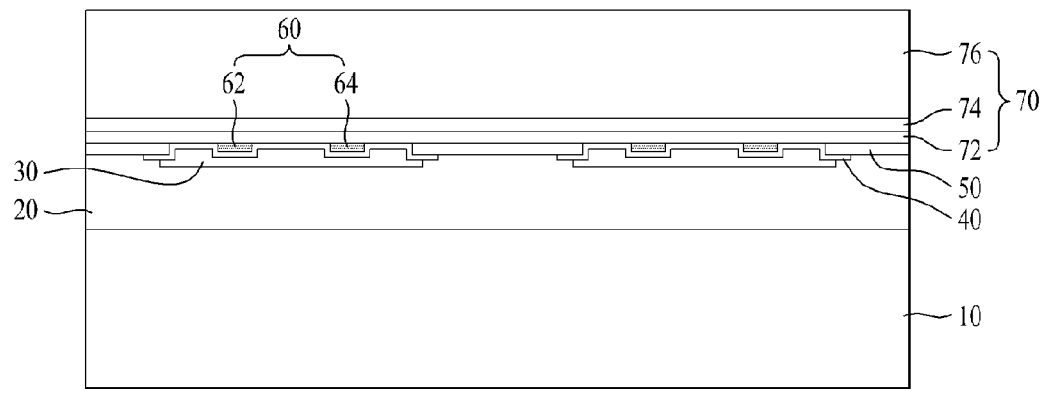

In addition, as shown in FIG. 21, the growth substrate 510 may be detached from the light emitting structure 70 by a laser-lift-off or chemical-lift-off process. FIG. 21 is an upside down view illustrating the structure shown in FIG. 20.

Figure 22:
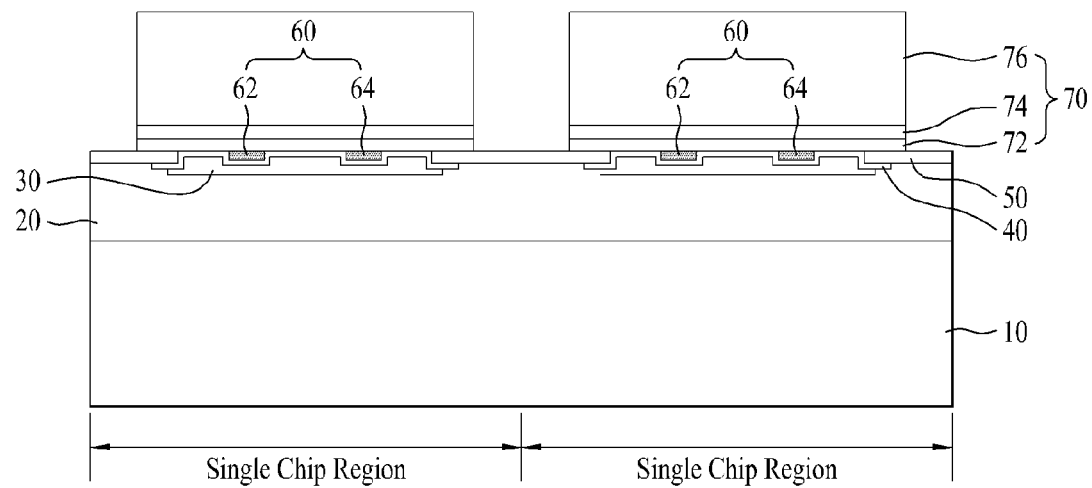

Continuously, as shown in FIG. 22, the light emitting structure 70 is subjected to isolation etching along the single chip region, so as to divide the structure into a plurality of light emitting sub-structures 70.

For instance, the isolation etching may be implemented by a dry etching process such as inductively coupled plasma (ICP).

Figure 23:
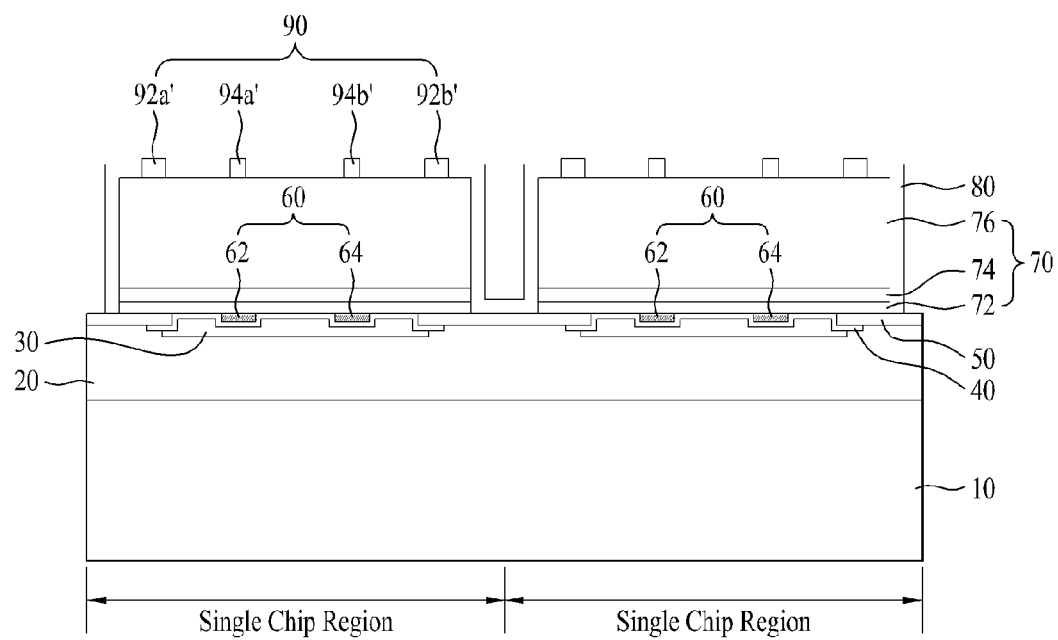

Lastly, as shown in FIG. 23, a passivation layer 80 is provided on the protective layer 50 and the light emitting structure 70 and then selectively removed therefrom, to expose the top side of the first conductive semiconductor layer 76. Further, an electrode 90 is provided on the exposed top side of the first conductive semiconductor layer 76.

Thereafter, a chip separation process is conducted to form separate single chip regions, thereby preparing a plurality of light emitting devices. Such chip separation may include, for example: a braking process using a blade to apply physical force to separate the structure into single chips; a laser scribing process of irradiating a laser beam at an interface of chips to form separate chips; an etching process including wet etching or dry etching, or the like.

Figure 24:
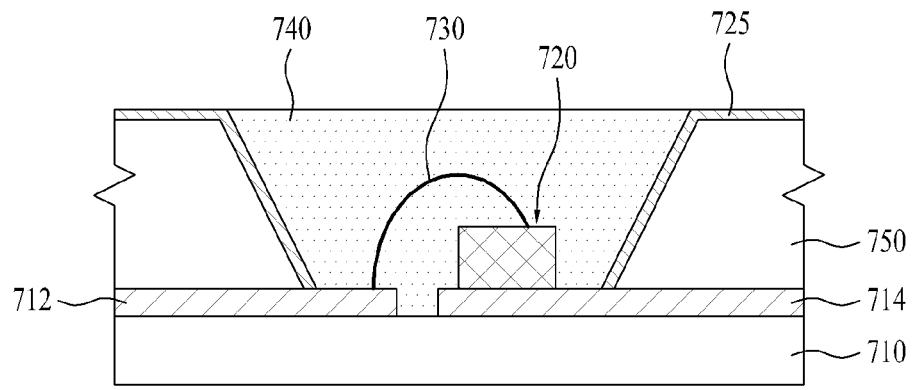
FIG. 24 illustrates a light-emitting device package including a light emitting device according to one embodiment.

FIG. 24 illustrates a light-emitting device package including a light emitting device according to one embodiment. Referring to FIG. 24, the light-emitting device package includes a package body 710, first and second metal layers 712 and 714, a light emitting device 720, a reflective plate 724, a wire 730 and a encapsulation layer 740.

The package body 710 may have a structure of a cavity formed on one side region thereof. A lateral wall of the cavity may be formed into an inclined face. The package body 710 may be formed of a silicon based wafer level package, a silicon substrate, or a substrate made of silicon carbide (SiC) or aluminum nitride AlN having good insulation and thermal conductivity, and may also have a laminate structure of plural substrates. Embodiments are not particularly limited to the foregoing, in terms of materials, structures and/or shapes of the package body.

The first metal and second metal layers 712 and 714 may be arranged on the surface of the package body 710 to be electrically isolated from each other, in consideration of heat dissipation or installation of the light emitting device. The light emitting device 720 may be formed according to any one of the foregoing first to eleventh embodiments.

For instance, the substrate 110 or 10 described in the foregoing embodiments may be electrically connected to the second metal layer 714 while the first electrode layer 150 or electrode 90 may be electrically connected to the first metal layer 712 through the wire 730.

In addition, any one of the first and second metal layers 712 and 714 may be electrically connected to the first electrode 952 of the light emitting device 500 while the other may be electrically connected to the second electrode 954.

The reflective plate 725 is provided on the lateral wall of the cavity in the package body 710, in order to orient light emitted by the light emitting device in a determined direction. The reflective plate 725 may be composed of a light reflective material, for example, may be a metal coating or metal foil.

The encapsulation layer 740 may surround and protect the light emitting device 720 placed in the cavity of the package body 710 from the external environment. The encapsulation layer 740 may be composed of a colorless and transparent polymer resin material such as silicone. The encapsulation layer 740 may include a phosphor to change a wavelength of the light emitted by the light emitting device 720. The light-emitting device package may be provided with at least one selected from the light emitting devices disclosed in the foregoing embodiments, without being particularly limited thereto.

The light-emitting device package according to one embodiment may be arrayed in plural on a substrate and optical members such as a light guide plate, prism sheet or diffusion sheet may be arranged on a light path of the light-emitting device package. Such a light-emitting device package, substrate and/or optical member may serve as a backlight unit.

In another embodiment, a display device, indicating device and/or lighting device having the light emitting device or the light-emitting device package disclosed in the foregoing embodiments may be realized. For example, a lighting system may include a lamp, a streetlamp, or the like.

Figure 25:
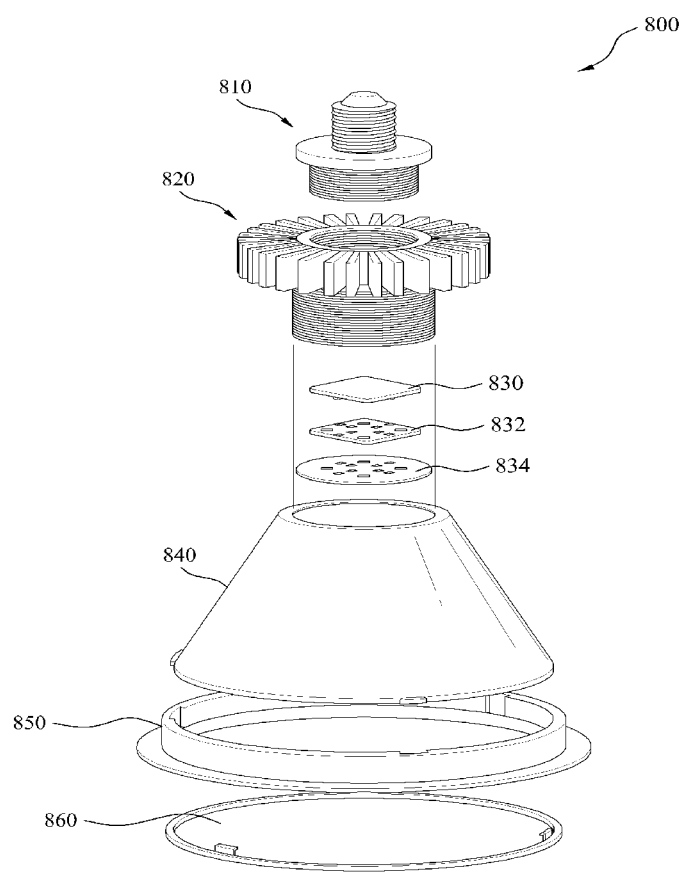
FIG. 25 illustrates a light instrument including a light emitting device according to one embodiment.

FIG. 25 illustrates a lighting instrument including a light emitting device according to one embodiment. Referring to FIG. 25, the lighting instrument includes a power supply connector 810, a heat sink 820, a light emitting module 830, a reflector 840, a cover cap 850, and a lens part 860.

A top end of the power supply connector 810 may be formed in a screw shape fitted into an external power supply socket (not shown), in turn supplying power to the light emitting module 830.

The heat sink 820 may be coupled to the power supply connector 810 and, depending upon connection extent, a position of the heat sink 820 may be controlled. For instance, the top end of the heat sink 820 may be screw coupled with the bottom end of the power supply connector 810. The heat sink 820 may discharge heat generated from the light emitting module 830 through a heat dissipation pin formed at a lateral side.

The light emitting module 830 including plural light-emitting device packages may be fixed to the bottom side of the heat sink 820 wherein the packages are mounted on a circuit board. Here, the light-emitting device packages may be the one described in the embodiment shown in FIG. 24.

The lighting instrument may further include an insulation sheet 832 and a reflection sheet 834 to electrically protect the light emitting module 830, all of which are provided under the light emitting module. In addition, an optical member having various optical functions on a light passage of the light emitted by the light emitting module 830 may be provided.

The reflector 840 may be in a circular truncated cone shape and bound to the bottom end of the heat sink 820, in turn reflecting light emitted by the light emitting module 830. The cover cap 850 may be in a circular ring form and bound to the bottom end of the reflector 840. The lens part 860 is fitted into the cover cap 850. The lighting instrument illustrated in FIG. 25 may be embedded into a ceiling or wall body and used as a down-light type instrument.

Figure 26:
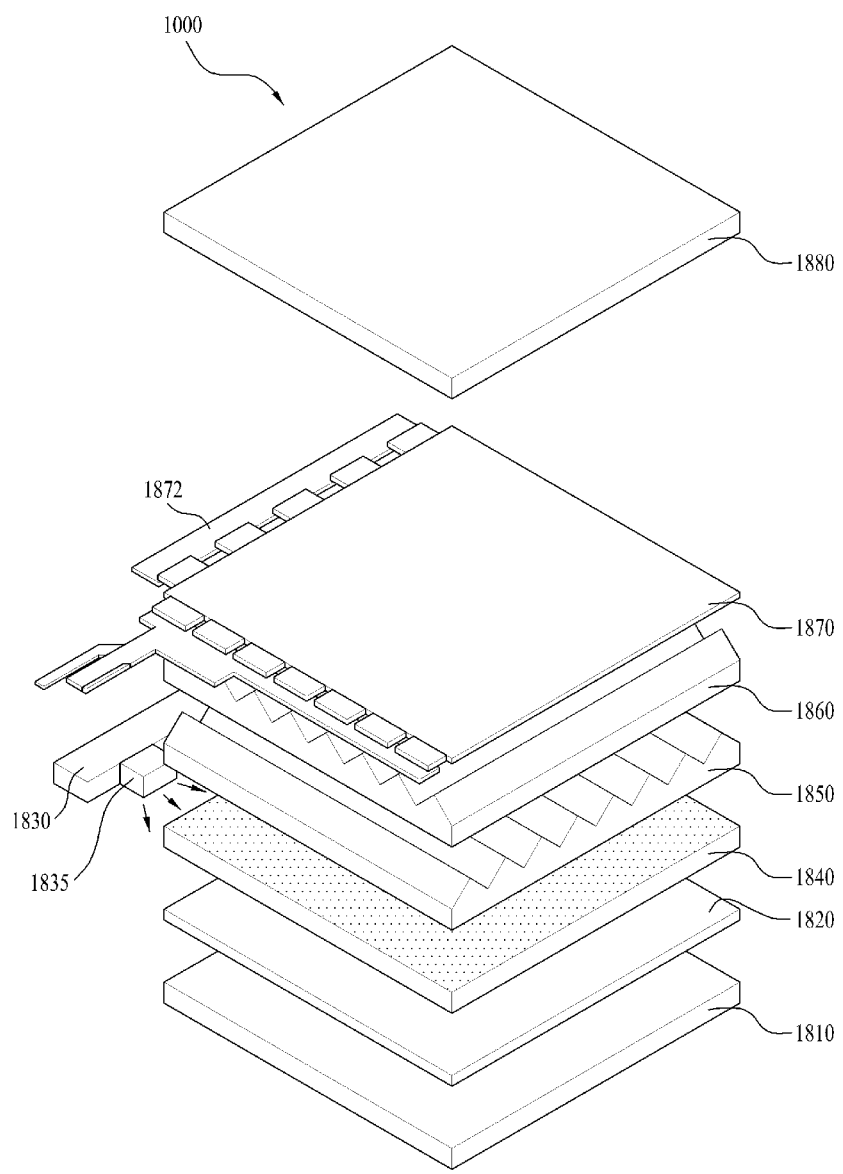
FIG. 26 illustrates a display apparatus including a light-emitting device package according to one embodiment.

FIG. 26 is a display including a light-emitting device package according to one embodiment.

Referring to FIG. 26, the display 1000 includes: a bottom cover 1810; a reflector 1820 arranged on the bottom cover 1810; light source modules 1830 and 1835 to emit light; a light guide plate 1840 which is arranged in front of the reflective plate 1820 and guides light emitted by the light source modules 1830 and 1835 in the front direction of the display; an optical sheet including prism sheets 1850 and 1860, which is arranged in front of the light guide plate 1840; a display panel 1870 arranged in front of the optical sheet; an image signal output circuit 1872 connected to the display panel 1870 to provide image signals to the display panel 1870; and a color filter 1880 arranged in front of the display panel 1870. Here, the bottom cover 1810, reflective plate 1820, light source modules 1830 and 1835, light guide plate 1840 and optical sheet may be combined to form a backlight unit.

The light source module may include the light-emitting device package 1835 placed on the substrate 1830, thus being completed. In this case, the substrate 1830 may be a PCB while the light-emitting device package 1835 may be the one described in the embodiment shown in FIG. 24.

The bottom cover 1810 may receive constitutional elements of the display 1000. Furthermore, the reflective plate 1820 may be provided as an additional element as shown in the figure or, otherwise, be coated with a material having high reflectivity on the front or rear side of the light guide plate 1840.

In this regard, the reflective plate 1820 may be composed of an ultra-slim material having high reflectivity and formed using polyethylene terephthalate (PET).

The light guide plate 1830 may be formed using polymethylmethacrylate (PMMA), polycarbonate (PC), polyethylene (PE), or the like.

A first prism sheet 1850 may be formed using a polymer material having transmissivity and elasticity on one face of a support film. Such polymer material may have a prism layer in which a plurality of stereoscopic structures is repeatedly arranged. Here, plural patterns may have crests and troughs repeatedly arranged in a stripe form.

A direction of crests and troughs formed on one face of a support film in a second prism sheet 1860 may be perpendicular to the direction of the crests and troughs formed on one face of the support film in the first prism sheet 1850. The purpose of this is to uniformly distribute light transmitted from the light source module and the reflective sheet throughout the display panel 1870.

Although not illustrated, a diffusion sheet may be arranged between the light guide plate 1840 and the first prism sheet 1850. The diffusion sheet may be composed of polyester and polycarbonate and maximally increase an angle of incidence of the light projected from the backlight unit through refraction and scattering. Moreover, the diffusion sheet may further include a support layer containing a light diffusing agent, and first and second layers which are formed at a light emitting face (a direction of the first prism sheet) and a light incidence face (a direction of the reflective sheet) and contains no light diffusing agent.

According to the foregoing embodiment, the diffusion sheet and the first and second prism sheets 1850 and 1860 may be combined to form an optical sheet. Otherwise, the optical sheet may be formed of any other combination, for example, a micro-lens array alone, a combination of a diffusion sheet and a micro-lens array, a combination of one prism sheet and a micro-lens array, or the like.

The display panel 1870 may be provided with a liquid crystal display panel or any desired display device, rather than the liquid crystal panel 1860.

According to embodiments, luminous efficiency and reliability may be enhanced.

What is claimed is:

1. A light emitting device, comprising:
 a second electrode layer;
 a light emitting structure including a second conductive semiconductor layer, an active layer and a first conductive semiconductor layer, which is provided on the second electrode layer;
 a first electrode layer including a pad part and an electrode part connected to the pad part, which is provided on the light emitting structure; and
 a current blocking layer arranged between the second electrode layer and the light emitting structure, wherein a part of the current block layer overlaps to correspond to the first electrode layer,
 wherein a width of one part of the current blocking layer corresponding to a first area of the electrode part, is greater than a width of another part of the current blocking layer corresponding to a second area of the electrode part, wherein the first area is closer to the pad part than the second area in a length direction of the electrode part.

2. The light emitting device according to claim 1, wherein the electrode part includes:
 an outer electrode provided at a periphery of the light emitting structure; and
 at least one inner electrode arranged at inner side of the outer electrode and connected to the outer electrode,
 wherein the pad part is connected to at least one of the outer electrode and the inner electrode.

3. The light emitting device according to claim 1, wherein the current blocking layer includes an overlap part and a non-overlap part corresponding to the electrode part, wherein a width of the non-overlap part of the current blocking layer is different depending upon a clearance with the pad part from the current blocking layer in a length direction of the electrode part.

4. The light emitting device according to claim 3, wherein a width of the non-overlap part of the current blocking layer corresponding to a first area of the electrode part, is greater than a width of another non-overlap part of the current blocking layer corresponding to a second area of the electrode part in a vertical direction,
 wherein the first area is closer to the pad part than the second area.

5. The light emitting device according to claim 1, wherein the width of the current blocking layer linearly increases.

6. The light emitting device according to claim 1, wherein the width of the current blocking layer corresponding to each of the first and second areas of the electrode part linearly increases.

7. The light emitting device according to claim 4, wherein the width of the non-overlap part of the current blocking layer corresponding to each of the first and second areas of the electrode part linearly increases.

8. The light emitting device according to claim 2, further comprising a passivation layer covering a lateral side and a part of the top side of the light emitting structure and contacting one side of the outer electrode,
 wherein the current blocking layer includes a part extending in the other side direction of the outer electrode and non-overlapping with the outer electrode.

9. The light emitting device according to claim 8, wherein a width of the non-overlap part of the current blocking layer to the outer electrode ranges from 5 to 350% of a width of the outer electrode.

10. The light emitting device according to claim 8, wherein a width of the non-overlap part of the current blocking layer to the inner electrode ranges from 5 to 350% of a width of the inner electrode.

11. The light emitting device according to claim 8, wherein the current blocking layer includes a third part non-overlapping with the inner electrode in one side direction of the inner electrode and a fourth part non-overlapping with the inner electrode in the other side direction of the inner electrode,
 wherein a width of the third part and a width of the fourth part are different.

12. The light emitting device according to claim 1, wherein the width of the electrode layer is constant.

13. The light emitting device according to claim 1, wherein the width of the current blocking layer increases stepwise.

14. The light emitting device according to claim 2, wherein the outer electrode is arranged in a rectangular shape having four sides and four apexes and the pad part is arranged at any one apex among the four apexes of the outer electrode.

15. The light emitting device according to claim 2, wherein the first area of the electrode part is one part of the outer electrode and the second area of the electrode part is another part of the outer electrode.

16. The light emitting device according to claim 2, wherein the width of the outer electrode layer is constant.

17. The light emitting device according to claim 4, wherein the outer electrode includes:
 first outer electrode and second outer electrode extending in a first direction; and
 third outer electrode, and fourth outer electrode extending in a second direction,
 wherein the first direction is one direction from first apex of the four apexes to second apex at one side adjacent to the first apex and the second direction is another direction from the first apex to third apex at the other side adjacent to the first apex, and
 wherein the inner electrode includes:
 at least one first inner electrode extending in the second direction to connect the first outer electrode with the second outer electrode; and at least one second inner electrode extending in the first direction to connect the third and fourth electrodes with at least one first inner electrode, and wherein the pad part is provided on a part at which the first outer electrode contacts the third outer electrode, the first area of the electrode part is one part of the outer electrode, and the second area of the electrode part is another part of the outer electrode.

18. A lighting instrument, comprising:

a power supply connector to supply power;

a heat sink coupled to the power supply connector;

a light emitting module that includes a light emitting device mounted on a circuit board and is fixed to the heat sink; and a reflector that is coupled to the heat sink and reflects light emitted by the light emitting module, wherein the light emitting device includes:

a second electrode layer;

a light emitting structure including a second conductive semiconductor layer, an active layer and a first conductive semiconductor layer, which is provided on the second electrode layer;

a first electrode layer including a pad part and an electrode part connected to the pad part, which is provided on the light emitting structure; and a current blocking layer arranged between the second electrode layer and the light emitting structure, wherein a part of the current block layer overlaps to correspond to the first electrode layer, wherein a width of one part of the current blocking layer corresponding to a first area of the electrode part, is greater than a width of another part of the current blocking layer corresponding to a second area of the electrode part, wherein the first area is closer to the pad part than the second area in a length direction of the electrode part.

* * * * *